United States Patent
Seidel et al.

(10) Patent No.: US 7,928,004 B2
(45) Date of Patent: Apr. 19, 2011

(54) NANO IMPRINT TECHNIQUE WITH INCREASED FLEXIBILITY WITH RESPECT TO ALIGNMENT AND FEATURE SHAPING

(75) Inventors: Robert Seidel, Dresden (DE); Carsten Peters, Dresden (DE); Frank Feustel, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 457 days.

(21) Appl. No.: 11/671,688

(22) Filed: Feb. 6, 2007

(65) Prior Publication Data
US 2008/0003818 A1 Jan. 3, 2008

(30) Foreign Application Priority Data
Jun. 30, 2006 (DE) .................. 10 2006 030 267

(51) Int. Cl.
*H01L 21/4763* (2006.01)
(52) U.S. Cl. .................. 438/637; 257/E21.579
(58) Field of Classification Search ............ 438/637; 257/E21.579
See application file for complete search history.

(56) References Cited

U.S. PATENT DOCUMENTS

| | | | |
|---|---|---|---|
| 5,173,442 A | 12/1992 | Carey | |
| 6,501,180 B1 | 12/2002 | Kitch | |
| 7,148,142 B1* | 12/2006 | Dakshina-Murthy et al. | 438/678 |
| 7,468,330 B2* | 12/2008 | Allen et al. | 438/780 |
| 2002/0127780 A1 | 9/2002 | Ma et al. | 438/127 |
| 2004/0023162 A1* | 2/2004 | Hasegawa et al. | 430/320 |
| 2004/0224261 A1 | 11/2004 | Resnick et al. | |
| 2005/0170269 A1 | 8/2005 | Nakagawa et al. | |
| 2005/0202350 A1* | 9/2005 | Colburn et al. | 430/320 |
| 2005/0250052 A1 | 11/2005 | Nguyen | 430/322 |
| 2006/0261518 A1* | 11/2006 | Willson et al. | 264/293 |
| 2007/0032058 A1* | 2/2007 | Sung | 438/597 |

FOREIGN PATENT DOCUMENTS

| | | |
|---|---|---|
| EP | 1 387 216 A2 | 2/2004 |
| GB | 2 233 494 A | 1/1991 |
| GB | EP 1 387 216 A2 | 2/2004 |
| WO | WO 01/03178 A1 | 1/2001 |
| WO | WO 01/50825 A1 | 7/2001 |
| WO | WO 03/030252 A2 | 4/2003 |
| WO | WO 2005/031855 A1 | 4/2005 |

OTHER PUBLICATIONS

Partial International Search Report Mailed Oct. 29, 2007.
Jun. 26, 2008 correspondence from foreign associate.
Translation of Official Communication issued May 26, 2008.
German Office Communication dated Oct. 19, 2007.
International PCT Search Report PCT/US2007/008371 and Written Opinion mailed Feb. 2, 2008.
International Search Report and Written Opinion Dated Feb. 2, 2008.

* cited by examiner

*Primary Examiner* — Steven J Fulk
(74) *Attorney, Agent, or Firm* — Williams, Morgan Amerson

(57) ABSTRACT

By forming metallization structures on the basis of an imprint technique, in which via openings and trenches may be commonly formed, a significant reduction of process complexity may be achieved due to the omission of at least one further alignment process as required in conventional process techniques. Furthermore, the flexibility and efficiency of imprint lithography may be increased by providing appropriately designed imprint molds in order to provide via openings and trenches exhibiting an increased fill capability, thereby also improving the performance of the finally obtained metallization structures with respect to reliability, resistance against electromigration and the like.

6 Claims, 11 Drawing Sheets

NANO IMPRINT TECHNIQUE WITH INCREASED FLEXIBILITY WITH RESPECT TO ALIGNMENT AND FEATURE SHAPING

BACKGROUND OF THE INVENTION

1. Field of the Invention

The present disclosure relates to the field of fabrication of microstructures, and, more particularly, to a method for defining microstructure features on the basis of nano imprint techniques.

2. Description of the Related Art

Fabrication of microstructures, such as integrated circuits, requires tiny regions of precisely controlled size to be formed in a material layer of an appropriate substrate, such as a silicon substrate. These tiny regions of precisely controlled size are generated by patterning the material layer, for instance, by performing photolithography and etch processes. For this purpose, in conventional semiconductor techniques, a mask layer is formed over the material layer under consideration to first define these tiny regions in the mask layer. Generally, a mask layer may consist of or is formed by means of a layer of photoresist that is patterned by a lithographic process, such as a photolithography process. During a typical photolithography process, the resist may be spin-coated onto the wafer surface and is then selectively exposed to ultraviolet radiation. After developing the photoresist, depending on the type of resist, positive resist or negative resist, the exposed portions or the non-exposed portions are removed to form the required pattern in the layer of photoresist. Since the dimensions of the patterns in sophisticated integrated circuits are steadily decreasing, the equipment used for patterning device features have to meet very stringent requirements with regard to resolution and overlay accuracy of the involved fabrication processes. In this respect, resolution is considered as a measure specifying the consistent ability to print minimum size images under conditions of predefined manufacturing variations. One important factor in improving the resolution is represented by the photolithography process, in which patterns contained in a photo mask or reticle are optically transferred to the substrate via an optical imaging system. Therefore, great efforts are made to steadily improve optical properties of the lithographic system, such as numerical aperture, depth of focus and wavelength of the light source used.

The quality of the lithographic imagery is extremely important in creating very small feature sizes. Of at least comparable importance, however, is the accuracy with which an image can be positioned on the surface of the substrate. Many types of microstructures, such as integrated circuits, are fabricated by sequentially patterning material layers, wherein features on successive material layers bear a well-defined spatial relationship to one another. Each pattern formed in a subsequent material layer has to be aligned to a corresponding pattern formed in the previously patterned material layer within specified registration tolerances. These registration tolerances are caused by, for example, a variation of a photoresist image on the substrate due to non-uniformities in such parameters as resist thickness, baking temperature, exposure and development. Furthermore, non-uniformities of the etching processes can also lead to variations of the etched features. In addition, there exists an uncertainty in overlaying the image of the pattern for the current material layer to the etched pattern of the previously formed material layer while photolithographically transferring the image onto the substrate. Several factors contribute to the ability of the imagery system to perfectly overlay two layers, such as imperfections within a set of masks, temperature differences at the different times of exposure and a limited registration capability of the alignment tool. As a result, the dominant criteria, determining the minimum feature size that may finally be obtained, are the resolution for creating features in individual substrate layers and the total overlay error to which the above explained factors, in particular the lithographic process, contribute.

The continuous scaling of microstructures requires a corresponding adaptation of photolithography systems with respect to exposure wavelength, beam optics, alignment means and the like in order to provide the required resolution, which, however, places a high burden on the tool manufacturers in view of development efforts, while the manufacturers of microstructures are confronted with increasing tool investments and significant cost of ownership. Hence, new techniques have been proposed for defining microstructure features in respective material layers, while avoiding or reducing some of the problems associated with conventional photolithography techniques. One promising approach is the nano imprint technique, which is a method for mechanically transferring a pattern defined in a mold or die into an appropriate mask layer, which may then be used for patterning the material layer under consideration. For example, during the manufacturing of metallization layers of sophisticated semiconductor devices, requiring metal structures with reduced feature sizes, low parasitic capacitance and high resistance against electromigration, usually the so-called inlaid or damascene technique is used. In this technology for forming wiring layers that provide the complex circuit layout of integrated circuits, an appropriate dielectric material is patterned to receive trenches and vias, which are subsequently filled with a highly conductive material, such as copper, copper alloys, silver or any other suitable metal. Hence, the vias, providing the electrical connection between metal regions of different stacked metallization layers, have to be precisely aligned with respect to the metal regions, such as metal lines, wherein the lateral dimensions of the metal lines and vias, at least in lower-lying metallization layers, are comparable to the minimum critical dimensions, thereby requiring highly sophisticated lithography techniques. In addition, the surface topography in higher device layers may have to be thoroughly controlled for optical patterning techniques, which may require highly sophisticated planarization techniques due to the usage of low-k dielectric materials, which may have a reduced mechanical stability compared to "conventional" dielectric materials, such as silicon dioxide, silicon nitride and the like. Thus, by avoiding an optical patterning regime, respective trenches or vias may be formed on the basis of nano imprint techniques, wherein a resist material or any other mask material is contacted by a corresponding die having a relief that includes respective lines and spaces for forming trenches, when trenches for metal lines are to be formed. In a next process step, the mask layer may be used to transfer the pattern from the mask layer into the material layer, such as the dielectric material of the metallization layer.

Although many problems associated with photolithography may be avoided by using the nano imprint technique, the trenches defined by the imprint process have to be precisely aligned to previously formed vias, thereby also imposing very stringent constraints on the imprint process technique. In other situations, the nano imprint technique suffers from reduced flexibility with respect to the shaping of openings when directly formed in an interlayer dielectric material, since then the adjustment of exposure and/or etch parameters for obtaining, for instance, a tapered shape, as is used as an efficient control regime in conventional photolithography techniques, may no longer be available.

The present disclosure is directed to various methods that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for forming features of microstructures, such as semiconductor devices, using techniques in which a mechanical interaction is used in order to form or provide a respective feature, such as a conductive line, a via and the like, within a specified material layer. For this purpose, an enhanced degree of flexibility is provided in some aspects by significantly reducing the number of process steps required for forming, for instance, metallization layers of semiconductor devices in that via openings and trenches may be defined in a common imprint process. In other aspects, the sidewall configuration of trenches, vias and the like may be effectively adjusted on the basis of a correspondingly designed imprint mold or die in order to obtain non-perpendicular sidewall portions, as may be advantageous for a plurality of specific device features, such as trenches and openings for features in metallization layers and the like. Consequently, by reducing the process complexity of imprint techniques and/or by providing enhanced flexibility in shaping respective features, the overall performance of the respective microstructure device may be enhanced at reduced process complexity, since, for instance, any critical alignment operations may be reduced and/or the process performance of certain circuit features may be enhanced, for instance by obtaining an improved fill behavior, when metallization structures of sophisticated semiconductor devices are considered.

According to one illustrative embodiment disclosed herein, a method comprises commonly imprinting a via opening and a trench into a moldable material layer that is formed above a substrate, wherein the via opening and the trench correspond to features of a metallization structure of a microstructure device. Furthermore, the method comprises forming a via and a conductive line on the basis of the via opening and the trench.

According to another illustrative embodiment disclosed herein, a method comprises imprinting an opening into a moldable material layer formed above a substrate, wherein the opening corresponds to a feature of a microstructure device and has a sidewall portion of non-perpendicular orientation with respect to a bottom of the opening. Furthermore, the method comprises forming the feature on the basis of the opening, wherein the feature has a non-perpendicular sidewall portion with respect to a bottom of the feature.

According to yet another illustrative embodiment disclosed herein, a method comprises forming a metallization layer for a semiconductor device and mechanically transferring the metallization layer to a substrate having formed thereon a plurality of circuit elements.

BRIEF DESCRIPTION OF THE DRAWINGS

The disclosure may be understood by reference to the following description taken in conjunction with the accompanying drawings, in which like reference numerals identify like elements, and in which.

Figure 1A:
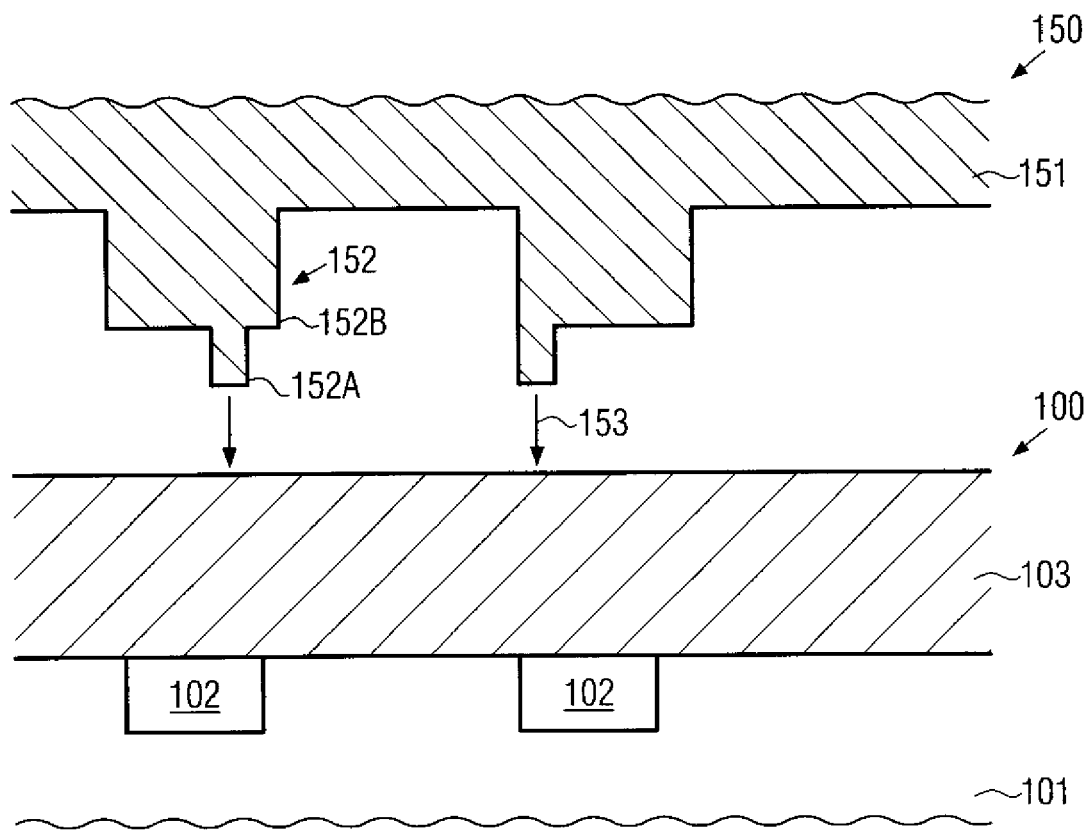
FIGS. 1a-1e schematically illustrate cross-sectional views of a microstructure during the formation of a via/line metallization structure in a common imprint process for directly forming the respective openings in an interlayer dielectric material according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for forming features of microstructures, such as semiconductor devices and the like, in which at least some of the photolithography steps are replaced by an imprint technique in which a feature, or at least a mask layer for forming a feature, is formed by a direct mechanical contact between a moldable material and a corresponding imprint mold or nano die or stamp, wherein, in some aspects, two different types of features may be formed in a common imprint process in order to reduce the number of required alignment processes and also reduce the number of individual process steps, such as deposition steps, planarization steps and the like. In another aspect, the shaping of respective features may be accomplished by appropriately designing respective imprint molds in order to enhance performance of the respective feature and/or enhance the performance of the respective patterning process. For example, in some illustrative embodiments, tapered vias or trenches may be formed on the basis of correspondingly designed imprint die or molds in order to significantly enhance the fill behavior of a corresponding deposition process for reliably filling in a conductive material, such as metals, metal alloys and the like. Consequently, the overall process efficiency and thus production costs may be reduced, since, at many manufacturing stages, highly cost extensive and complex photolithography steps may be avoided, or respective photolithography processes may be used for forming appropriate imprint molds, thereby considerably "multiplying" the efficiency of the respective photolithography, since a single photolithography process may result in a corresponding imprint mold or die that in turn may be used for processing a plurality of substrates.

FIG. 1a schematically illustrates a microstructure device 100, which, in some illustrative embodiments, may represent a semiconductor device that may receive a metallization structure in order to electrically connect respective circuit elements, such as transistors, capacitors, resistors and the like, formed therein. In other cases, the microstructure device 100 may represent a device having formed therein opto-electronic components and/or mechanical components and the like. The microstructure device 100 may comprise a substrate 101, which may represent any appropriate substrate, such as a silicon-based semiconductor substrate that may include a buried insulating layer (not shown), when a silicon-on-insulator (SOI) architecture is considered, in which an appropriate semiconductor layer is formed on a respective insulating layer. In other cases, the substrate 101 may represent any appropriate carrier material having formed thereon an appropriate material layer that allows the manufacturing of respective components, at least some of which may require a corresponding metallization structure in order to provide the electrical interconnection between the respective circuit elements. In still other cases, the substrate 101 may represent any appropriate carrier material, above which is to be formed a metallization structure that may be transferred to a respective semiconductor device in a later stage, as will be described later on in more detail. In some illustrative embodiments, the substrate 101 may have formed therein a plurality of features including respective contact regions 102, which may be provided in the form of highly conductive semiconductor regions, metal regions and the like. Moreover, a layer of moldable material 103 may be formed above the substrate 101, wherein, in the embodiment illustrated in FIG. 1a, the layer 103 may represent an appropriate dielectric material for forming therein features of a metallization structure.

For instance, in some illustrative embodiments, the moldable material of the layer 103 may be comprised of a dielectric having a relative permittivity of 3.0 and significantly less, which are typically referred to as low-k dielectrics or even as ultra low-k dielectrics. It should be appreciated in this context that the term "moldable" refers to material characteristics that allow a mechanical contact with an imprint mold or die, i.e., a negative form of an opening to be formed in the material layer 103, so as to deform the moldable material and subsequently to remove the respective imprint die, wherein then the moldable material 103 may substantially maintain the deformed shape after removal of the imprint mold. For example, a wide class of thermal plastic materials are available which may be brought into a low viscous state upon applying heat so that in the low viscous state a respective deformation of the material 103 may be accomplished, wherein after cooling down the thermal plastic material, the respective deformed shape may be maintained even after removal of the deforming imprint die. In other cases, respective materials, such as polymer materials, resist materials and the like, may be provided in a low viscous state and may, after contact with a respective imprint mold, be hardened, for instance on the basis of UV radiation, heat treatment and the like, so as to maintain the deformed shape.

In the embodiment shown in FIG. 1a, the microstructure device 100 is shown prior to the contact with a respective imprint mold or die 150 which may comprise a substrate 151 made of any appropriate material, such as silicon, silicon dioxide, metals, metal alloys, certain plastic materials and the like. Furthermore, the imprint mold 150 may comprise a plurality of negative forms 152 of respective complex openings to be formed in the material layer 103. In the embodiment shown, the negative forms 152 may comprise a via portion 152A and a trench portion 152B, which may correspond to respective vias and metal lines of a metallization structure to be formed in the dielectric layer 103. For example, in sophisticated microstructure devices, such as the device 100, respective metal lines or other conductive lines having a width of approximately 100 nm to several μm may have to be formed, depending on the level of the metallization structure under consideration and the minimum critical dimensions for any circuit elements of the device 100.

As previously explained, respective features of metallization structures are typically formed on the basis of photolithography and corresponding etch processes, wherein highly complex lithography tools including highly complex alignment entities are required. During a respective manufacturing sequence for forming a via and a metal line connected thereto, irrespective of the process strategy considered, the trench and the via have to be aligned to each other, which may finally result in a respective alignment error that has to be taken into consideration by the respective design rules. By using the imprint mold 150 including the respective negative forms 152A of corresponding via openings and the negative forms 152B representing respective trenches, the vias and metal lines are automatically aligned to each other with high precision, thereby reducing process complexity, increasing device performance and enabling the reduction of process margins that usually have to be provided to take into consideration a certain degree of misalignment between via openings and trenches.

A typical process flow for forming the microstructure device 100 may comprise the following processes. After the formation of any microstructure features, if provided, such as the conductive regions 102, or any other circuit elements on the basis of well-established techniques, which may comprise photolithography processes or other imprint processes, as will be described later on, implantation processes, etch techniques, planarization processes and the like, the moldable material of the layer 103 may be formed on the basis of any appropriate deposition technique. For instance, the layer 103 may be applied in a low viscous state by spin-on techniques and may be maintained in the low viscous state, when it is a curable material such as a specific polymer material, a moldable resist material and the like. In other illustrative embodiments, the layer 103 may be formed by any appropriate deposition technique and may be appropriately treated so as to transit into a highly deformable state, for instance by heat treating the layer 103, when a thermal plastic material is used. Next, the imprint mold 150 is then positioned and aligned relative to the microstructure 100 on the basis of well-established alignment tools, for instance using respective mechanical alignment marks (not shown), optical alignment marks and the like. After appropriately positioning the imprint mold 150 and the microstructure 100 relative to each other, the imprint mold 150 and/or the microstructure device 100 are moved relatively to each other as indicated by the arrows 153 while substantially maintaining their lateral position.

Figure 1B:
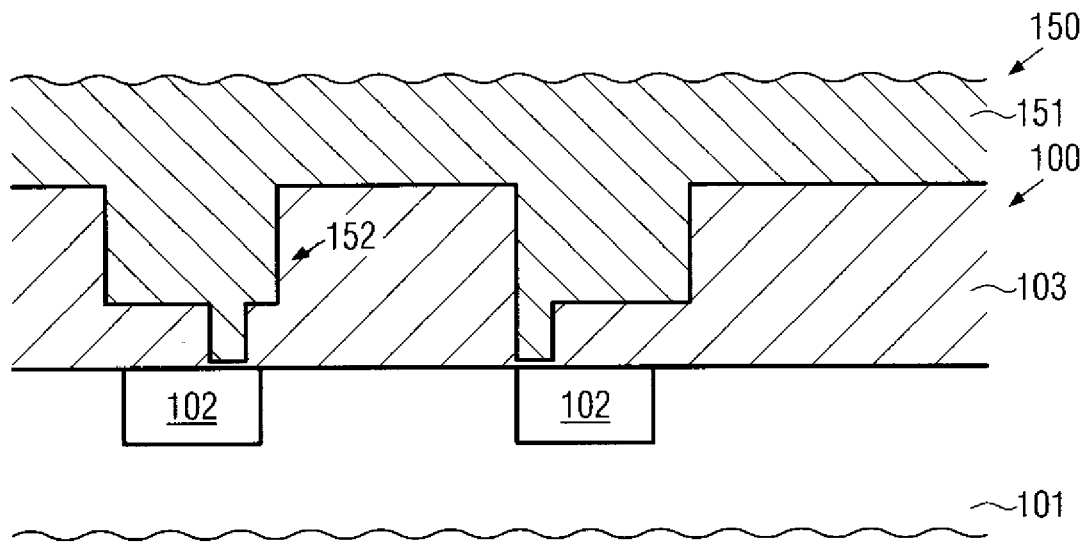

FIG. 1b schematically illustrates the microstructure device 100 when it is in contact with the imprint mold 150, wherein the respective negative forms 152 have deformed the moldable material layer 103 in order to define the via opening and a trench therein. Thereafter, the layer 103 may be treated, for instance by reducing the temperature thereof, hardening the layer 103 by an appropriate treatment, such as UV (ultra violet) radiation and the like, in order to bring the material of the layer 103 into a substantially non-deformable state, that is, in a state in which the material layer 103 may substantially maintain its form after removal of the imprint mold 150 with a desired high degree of fidelity.

Figure 1C:
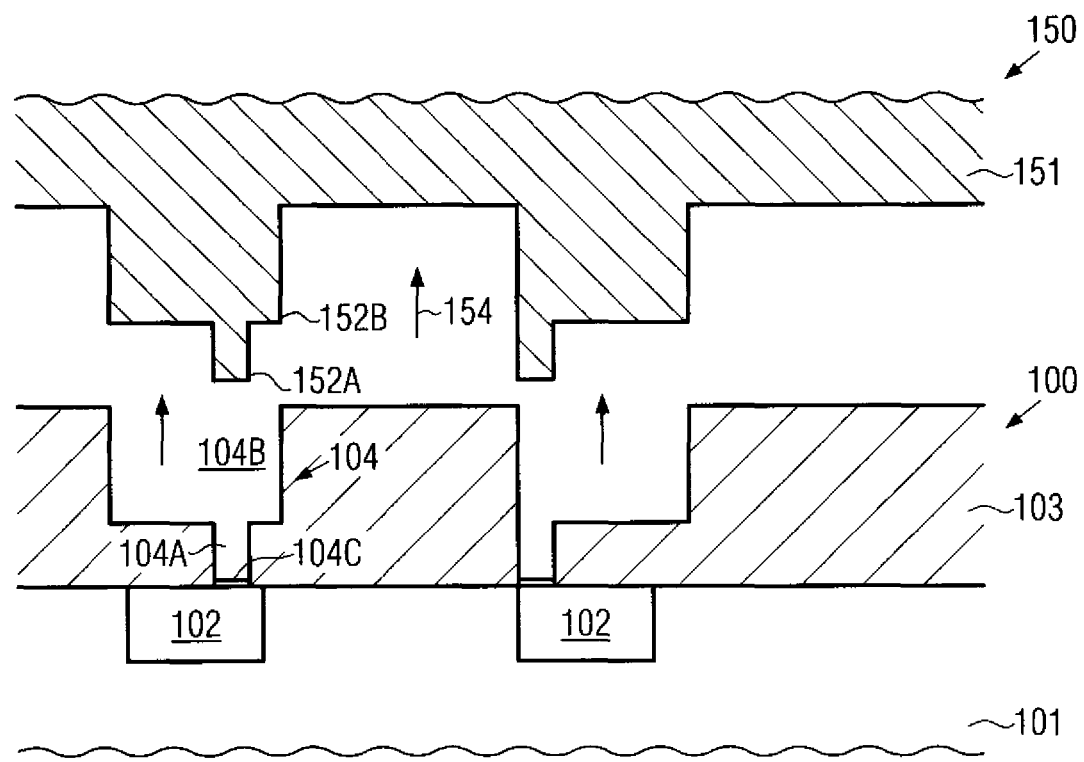

FIG. 1c schematically illustrates the microstructure device 100 when the imprint mold 150 is removed, as indicated by the arrows 154, thereby leaving, due to the substantially non-deformable state of the material 103, a respective imprinted structure 104 comprising a via opening 104A and a trench 104B, which substantially corresponds in size and shape to the respective negative forms 152A, 152B, respectively, of the imprint mold 150. It should be appreciated that the imprint mold 150 may have a low adhesion to the material of the layer 103 in its substantially non-deformable state, which may be accomplished on the basis of a respective surface treatment or material composition by using well-established techniques for nano imprint processes. Moreover, during commonly imprinting the via opening 104A and the trench 104B into the layer 103, the height level of the material in the layer 103 may change due to the additional volume of the respective negative forms 152, wherein a respective increase of the height level may locally vary, depending on the pattern density of the respective negative forms 152 across the substrate 101. When a fluid communication between respective portions of the layer 103 across the substrate 101 may not be provided, for instance due to the pattern configuration of the negative forms 152B, substantially suppressing a fluid communication in a final stage of positioning the imprint mold 150 in the material 103, the mold 150 may have respective fluid channels (not shown) which may provide an efficient communication between different device portions or which may allow removal of excess material of the layer 103. Consequently, upon removing the imprint mold 150 from the layer 103 in its substantially non-deformable state, a substantially planar surface configuration may be obtained wherein, depending on whether excess material of the layer 103 has been removed prior to bringing the material of layer 103 in its non-deformable state, the thickness of the layer 103 may be different from a thickness of the layer 103 as originally deposited. Furthermore, respective material residues 104C may still be present at a bottom of the respective via openings 104A due to minor non-uniformities with respect to the surface topography of the microstructure 100 and/or of the imprint mold 150, thereby resulting in a non-perfect mechanical contact with the underlying structure, such as the conductive regions 102.

Figure 1D:
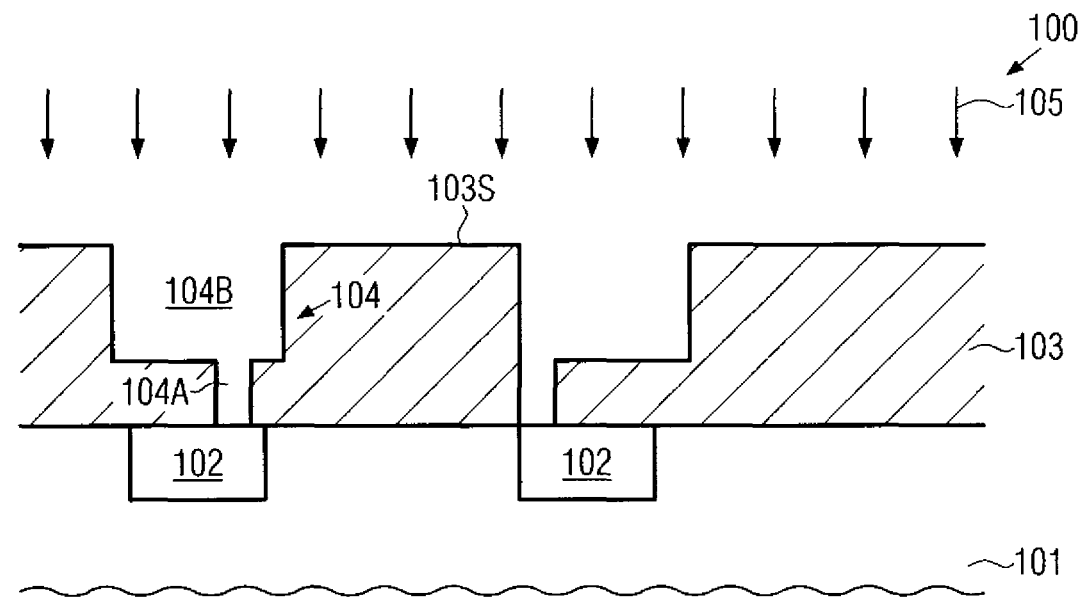

FIG. 1d schematically illustrates the microstructure device 100 in a further advanced manufacturing stage, in which the structure 100 is subjected to an etch ambient 105 for removing the material residues 104C. During the etch process 105, well-established recipes may be used in order to efficiently remove the residues 104C, wherein, in some illustrative embodiments, a certain degree of selectivity of the etch chemistry of the process 105 with respect to the material of the conductive regions 102 may be provided. In this way, the process time of the etch process 105 may be controlled so as to reliably remove the residues 104C across the entire substrate 101 substantially without causing undue damage in the underlying regions 102. Moreover, due to the etch process 105, material of the layer 103 may be removed outside of the via openings 104A, wherein, however, the respective depths of the trenches 104B may remain substantially the same due to the concurrent material removal within the trench 104B and the horizontal surface portions 103S of the layer 103 while the total thickness of the layer 103 may be reduced, depending on the degree of over-etching during the process 105. Thereafter, the microstructure device 100 may be prepared for filling the respective structure 104 by a conductive material, such as a metal, metal alloys and the like, in order to provide a respective via and metal line in order to form a respective metallization structure of the microstructure 100.

Figure 1E:
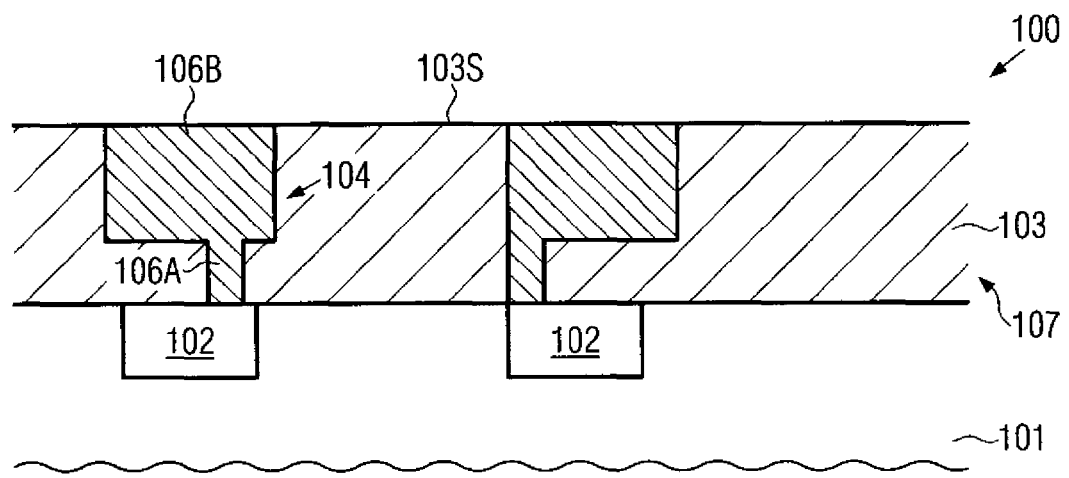

FIG. 1e schematically illustrates the microstructure device 100 in a further advanced manufacturing stage, wherein respective vias 106A are provided within the previously formed via openings 104A so as to connect to the underlying conductive regions 102. Furthermore, conductive lines 106B are formed within the previously defined trenches 104B. Consequently, the material layer 103 representing any appropriate dielectric material may, in combination with the conductive lines 106B and the vias 106A, define a respective metallization layer 107, wherein the respective conductive lines 106B provide the inner-level electrical connection, while the vias 106A provide electrical contact to the conductive regions 102, which may represent contact plugs, contact regions of circuit elements, metal regions of lower-lying metallization layers and the like. It should be appreciated that, depending on the technology node of the microstructure 100 under consideration, lateral dimensions, i.e., in FIG. 1e the horizontal extensions of the vias 106A and the conductive lines 106B, may be 100 nm and even significantly less for highly advanced semiconductor devices, wherein the respective dimensions may depend on the device level and the respective current densities occurring during operation of the microstructure device 100. Moreover, it should be appreciated that the specific shape of the respective vias and/or conductive lines 106B may vary in accordance with design requirements. For example, the width and/or the depth of respective conductive lines 106B may be varied within the same device level, thereby providing a high degree of flexibility in adapting the respective metallization structures with respect to operational conditions, process conditions of deposition techniques and the like. The same holds true for the vias 106A. Furthermore, the vias 106A and the conductive lines 106B may be formed on the basis of any appropriate conductive material, wherein, in sophisticated applications, highly conductive metals, such as copper, copper alloy, silver, silver alloy and the like, may be used in order to provide high performance metallization structures. Depending on the characteristics of the conductive material to be filled into the respective via openings 104A and trenches 104B, the conductive material may also comprise a conductive barrier material in order to substantially prevent diffusion of metal into the surrounding dielectric material of the layer 103 and thus finally into sensitive device areas and to also substantially suppress an unwanted interaction between dielectric material or reactive components contained therein, such as oxygen, fluorine and the like, with the respective conductive material, such as copper, copper alloys and the like.

The microstructure 100 as shown in FIG. 1*e* may be formed on the basis of the following processes. After the etch process 105 (FIG. 1*d*), in some illustrative embodiments, a respective conductive barrier material (not shown) may be deposited on the basis of any appropriate deposition technique, such as sputter deposition, chemical vapor deposition (CVD), electroless plating, atomic layer deposition (ALD) and the like. For instance, an appropriate material, such as tantalum, tantalum nitride, titanium, titanium nitride, tungsten, tungsten nitride and the like, may be deposited by sputter deposition wherein a preceding sputter etch step, which may be performed as the etch process 105 or as an additional etch step, may result in a reliable exposure of the underlying conductive regions 102. Thereafter, an appropriate seed material, such as copper and the like, may be deposited, for instance by sputter deposition, electroless deposition and the like, followed by the deposition of the bulk metal, such as copper, copper alloy, silver, silver alloy and the like. Next, any excess material, such as barrier material, seed material and the actual bulk metal, may be removed on the basis of any appropriate technique, which may include electrochemical etching, chemical mechanical polishing (CMP) and the like. In some illustrative embodiments, during the respective removal of excess material, a CMP process may be performed, thereby also planarizing the surface topography of the microstructure device 100, which may also remove any unwanted differences in height level, which may have possibly been created during the common imprint process for forming the via openings 104A and the trenches 104B (FIG. 1*c*).

As a result, the metallization layer 107 including the vias 106A and the conductive lines 106B, which may have any appropriate size and shape, may be readily formed in a highly effective process sequence with a reduced degree of process complexity, since the vias 106A and the metal lines 106B may be formed on the basis of a common lithography process without requiring an individual alignment for each component. Moreover, the specific size and shape of the vias and lines 106A, 106B and in particular an intermediate portion thereof may be designed in accordance with device requirements without being restricted by photolithography and etch techniques, as is the case in many conventional patterning regimes. For instance, sidewalls of the vias 106A and/or of the trenches 106B may be readily adapted to process and device requirements, as will be described later on in more detail, substantially without being restricted to specific process parameters in process techniques, such as photolithography and etch processes. Moreover, in the embodiments shown with respect to FIGS. 1*a*-1*e*, the vias 106A and the lines 106B may be directly formed in the dielectric material of the metallization layer 107, i.e., in the moldable material layer 103, thereby also reducing process complexity.

With reference to FIGS. 2*a*-2*d*, further illustrative embodiments of the subject matter disclosed herein will now be described in more detail, in which a high degree of flexibility is obtained with respect to the dielectric material of a metallization layer so that non-moldable materials may be effectively used, while vias and trenches may still be formed by a common imprint technique.

Figure 2A:
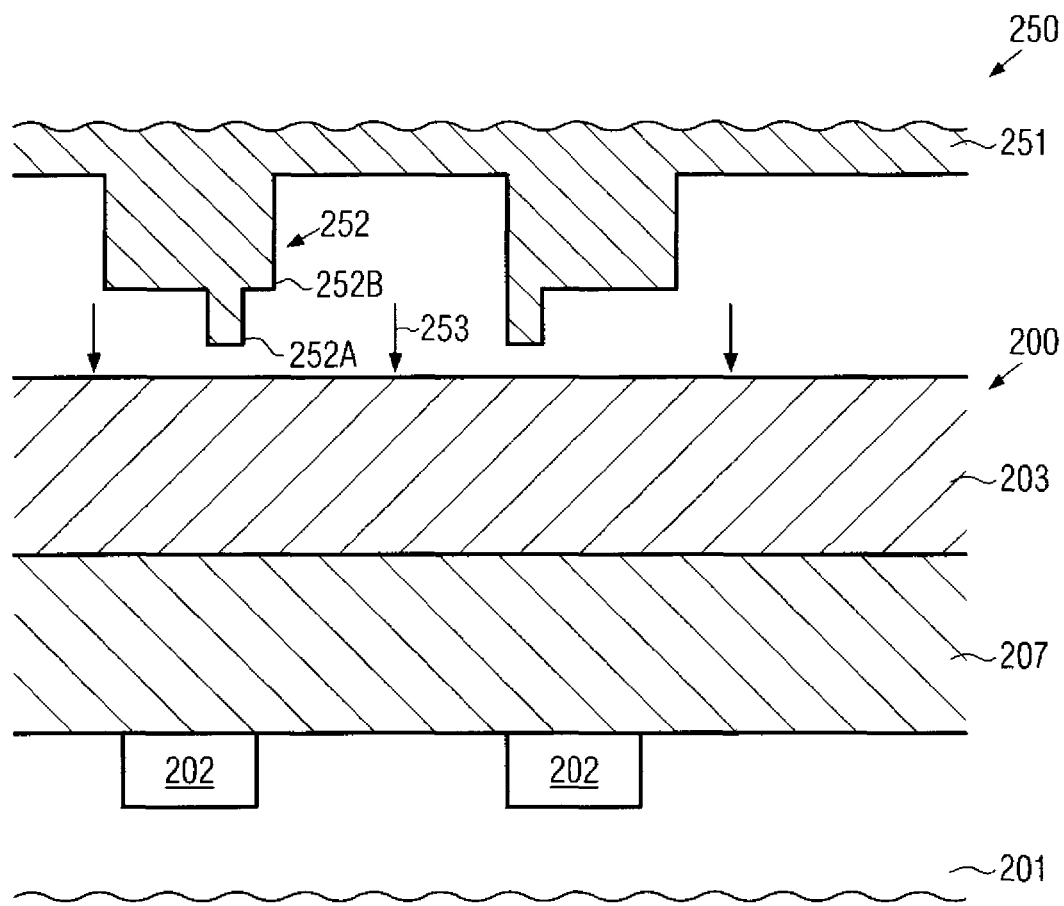
FIGS. 2a-2d schematically illustrate cross-sectional views of a microstructure device during the manufacturing of a via/line metallization structure based on a common imprint process with a subsequent etch process according to other illustrative embodiments.

FIG. 2*a* schematically illustrates a microstructure device 200 comprising a substrate 201, which may have formed therein conductive regions 202 to which an electrical connection is to be provided by one or more metallization layers to be formed above the substrate 201. With respect to the components 201 and 202, the same criteria apply as previously explained with reference to the microstructure device 100. Furthermore, in this manufacturing stage, a dielectric layer 207 may be provided above the substrate 201, wherein the material of the dielectric layer 207 may be selected with respect to its characteristics as an interlayer dielectric material for a metallization layer. For example, in sophisticated applications, the dielectric layer 207 may comprise a low-k dielectric material. Moreover, a mask layer 203 may be formed above the dielectric layer 207, which may be comprised of a moldable material, that is, a material that may have a highly deformable state when mechanically contacted by an imprint mold 250 and which may be brought into a highly non-deformable state so as to maintain a respective degree of deformation caused by the contact with the imprint mold 250. For example, the mask layer 203 may comprise a moldable resist material, a thermoplastic material and the like. The imprint mold or die 250 may comprise a respective substrate 251 having formed thereon respective negative forms 252 including a negative form 252A for a respective via opening and a corresponding negative form 252B corresponding to a trench. With respect to the imprint mold 250, the same criteria apply as previously explained with reference to the mold 150.

During the manufacturing stage as shown in FIG. 2*a*, the imprint mold 250 is aligned with respect to the microstructure device 200, similarly as is also described above with respect to the device 100 and the mold 150, and then the mold 250 is brought into contact with the mask layer 203, as indicated by the arrows 253, wherein the mask layer 203 is in a low viscous or highly deformable state.

Figure 2B:
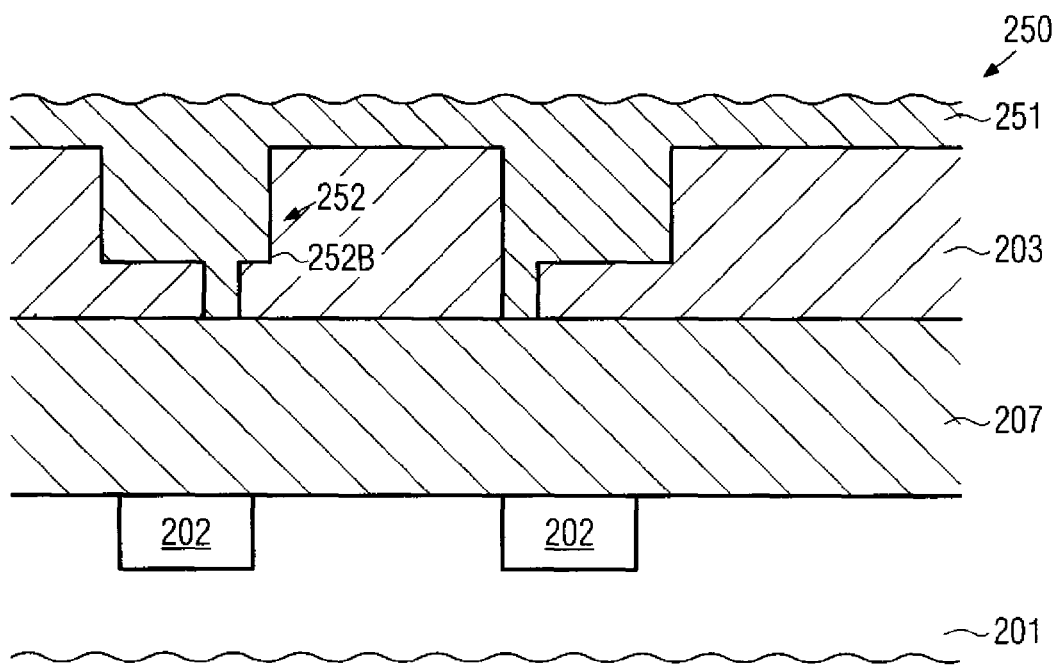

FIG. 2*b* schematically illustrates the situation when the imprint mold 250 is in contact with the mask layer 203, wherein a respective treatment, such as a heat treatment and/or UV radiation, is performed in order to bring the material of the mask layer 203 in a highly non-deformable state.

Figure 2C:
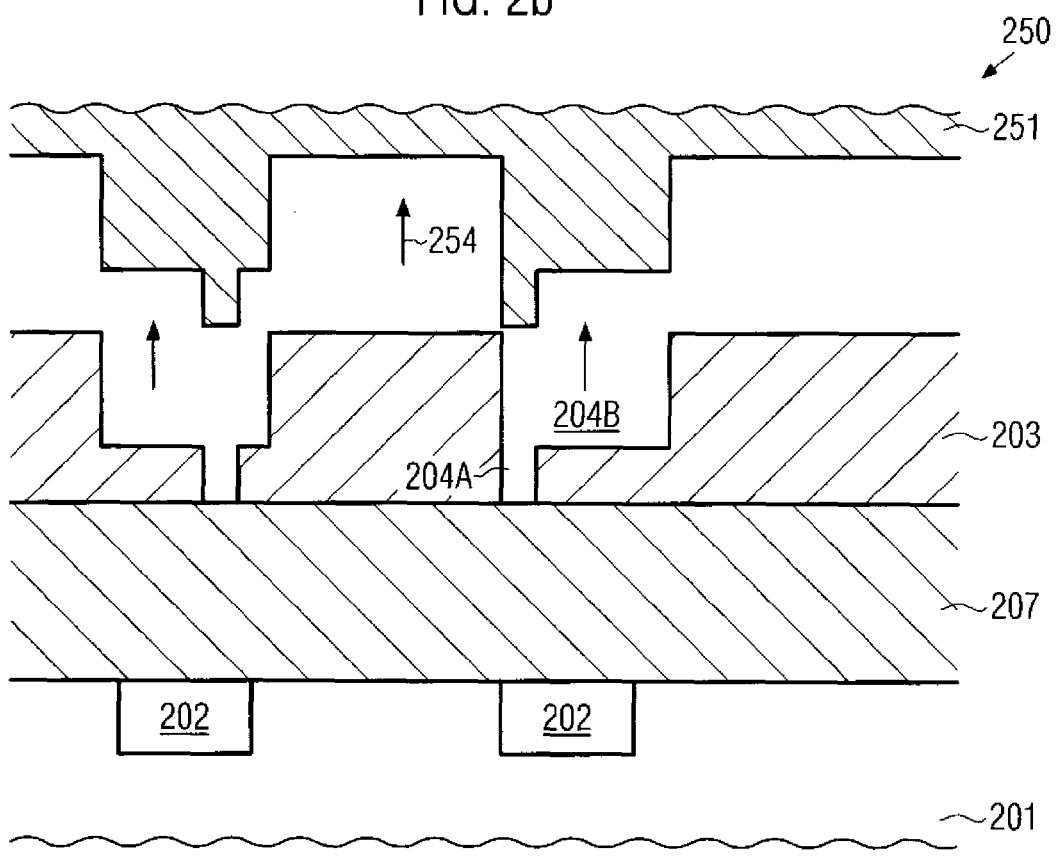

FIG. 2*c* schematically illustrates the removal of the imprint mold 250, as indicated by the arrows 254, thereby resulting in respective via openings 204A and trenches 204B due to the substantially non-deformable state of the mask layer 203. With respect to the characteristics of the imprint mold 250 in view of surface adhesion and the like, the same criteria apply as previously explained with reference to the imprint mold 150. Thus, after removal of the imprint mold 250, the patterned mask layer 203 may then be used as an image or mask during a subsequent anisotropic etch process for transferring the via opening 204A and the trench 204B into the underlying dielectric layer 207.

Figure 2D:
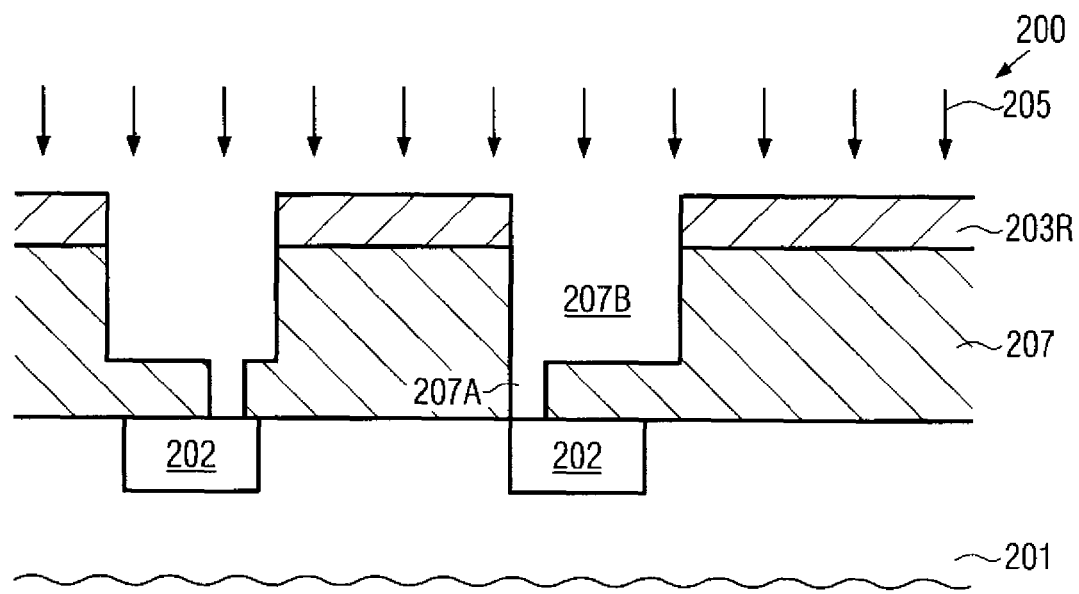

FIG. 2d schematically illustrates the microstructure device 200 during an anisotropic etch process 205, in which an etch chemistry may be used that results in a comparable etch rate for the material of the mask layer 203 and the underlying dielectric material of the layer 207. Consequently, a highly anisotropic etch behavior may be established, since a pronounced etch selectivity between the materials of the layers 203 and 207 is not required. Thus, during the etch process 205, material of the mask layer 203 is increasingly removed along with material of exposed portions of the dielectric layer 207. In this way, the vias 204A and trenches 204B of the mask layer 203 are increasingly "pushed" into the dielectric layer 206 so as to finally obtain respective via openings 207A and trenches 207B in the dielectric layer 207, wherein a high degree of etch fidelity may be accomplished due to the highly anisotropic behavior of the process 205. Thus, at a final stage of the etch process 205, the dielectric layer 207 may be covered by the residue of the mask layer 203, now indicated as 203R, while the etch process 205 may be continued in order to reliably expose the respective conductive regions 202 at the bottom of the via openings 207A, wherein the residue 203R may be consumed by the etch process 205. In some illustrative embodiments, the residue 203R may remain during the final stage of the etch process 205 and subsequently an additional etch process, for instance a wet chemical process, or a dry chemical process having a high selectivity between the material of the residue 203R and the dielectric layer 207, may be performed for removing the residue 203R, thereby providing enhanced process flexibility, since the initial thickness of the mask layer 203 is less critical.

After the removal of the residue 203R by the etch process 205 or by a subsequent additional etch step, the further processing for the microstructure device 200 may be performed in a similar manner as is previously described with respect to FIG. 1e for the device 100. That is, any appropriate process sequence may be performed in order to fill in an appropriate conductive material, such as a barrier material, and highly conductive metals in order to provide respective vias and conductive lines to define, commonly with the dielectric layer 207, a respective metallization layer. Consequently, the respective metallization structure may be formed on the basis of a highly efficient imprint process, wherein respective via openings and trenches may be formed in a common process step while additionally a high degree of flexibility in selecting an appropriate dielectric material for a metallization layer is provided.

With reference to FIGS. 3a-3d, further illustrative embodiments will now be described, in which a metallization structure may be formed on the basis of an efficient imprint technique, wherein a sacrificial layer may be used for defining respective via openings and trenches and for forming the metallization structure.

Figure 3A:
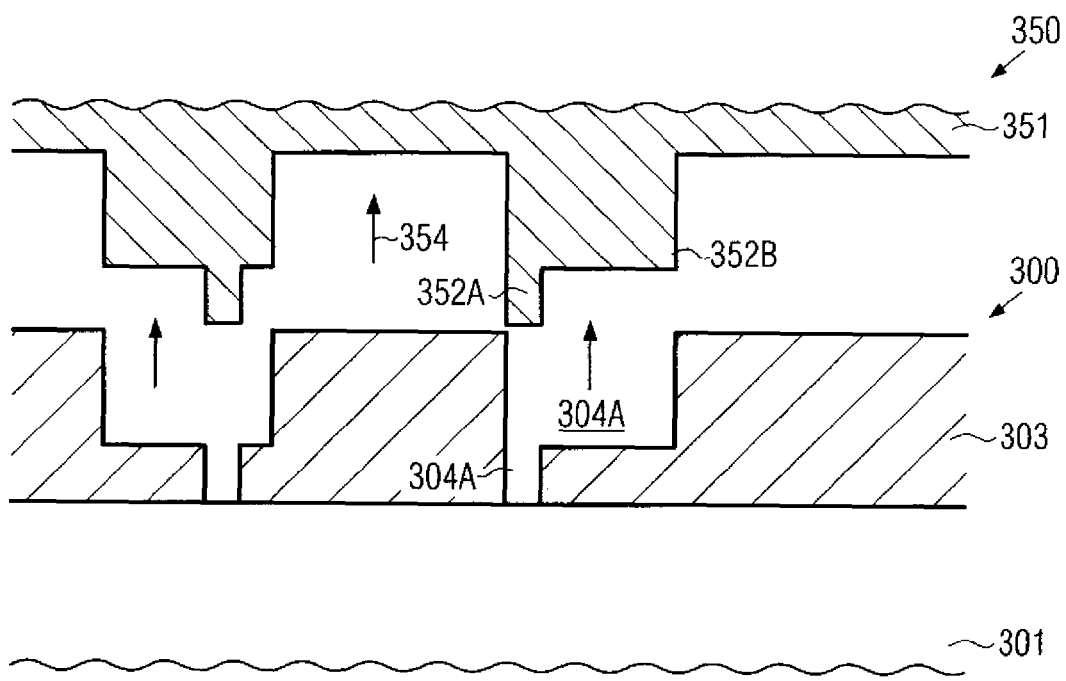
FIGS. 3a-3e schematically illustrate cross-sectional views during various manufacturing stages for forming a via/line structure on the basis of a common imprint process with a subsequent removal of dielectric material according to further illustrative embodiments.

FIG. 3a schematically illustrates a cross-sectional view of a microstructure device 300 comprising a substrate 301 and a layer of moldable material 303 formed thereabove. Moreover, an imprint mold 350 including a negative form for via openings 352A and for trenches 352B is shown during the removal from the layer 303, which is in a highly non-deformable state in order to define respective via openings 304A and trenches 304B therein. With respect to the characteristics of the imprint mold 350, it is referred to the respective components 150 and 250 as previously described. Furthermore, the microstructure 300 may represent a microstructure device as previously described with reference to the devices 100 and 200 or may represent a base component for forming therein one or more metallization structures. Thus, the substrate 301 may represent any appropriate carrier material for forming thereon the moldable material layer 303 and may, in some illustrative embodiments, have formed therein respective circuit elements and conductive regions (not shown), while, in other embodiments, substantially no other functional components may be provided in the substrate 301. The moldable material layer 303 may be provided in the form of any appropriate material, the dielectric characteristics of which may not be essential, since the layer 303 may be used as a sacrificial layer that may be removed after forming therein respective vias and metal lines.

Figure 3B:
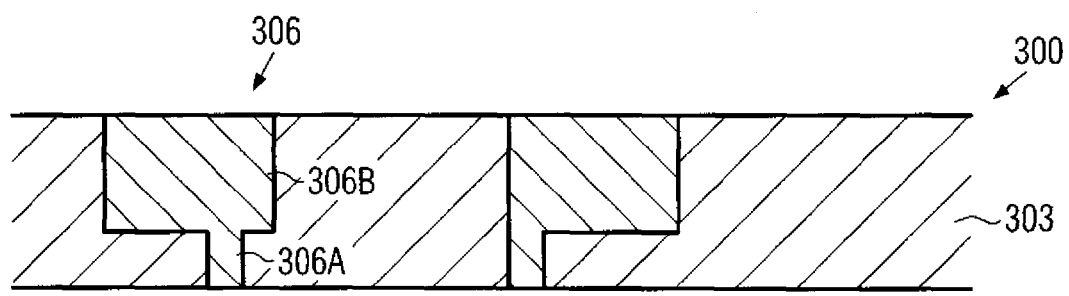

FIG. 3b schematically illustrates the microstructure device 300 in a further advanced manufacturing stage. Respective vias 306A and conductive lines 306B are formed within the sacrificial layer 303, wherein any appropriate conductive material may be used for forming the vias 306A and the lines 306B. In one illustrative embodiment, an appropriate highly conductive metal, such as copper, copper alloys, silver, silver alloys and the like, may be filled into the respective via openings 304A and trenches 304B (FIG. 3a), wherein a preceding step for forming a respective barrier material may not be necessary since the corresponding barrier characteristics may be provided in a later stage. In some illustrative embodiments, a surface portion of the substrate 301 may comprise any appropriate catalyst material, such as palladium, platinum, copper and the like, which may be exposed during the formation of the via openings 304A and the trenches 304B. Hence, highly efficient electroless plating techniques may be used, for instance on the basis of copper and copper alloys, thereby significantly relaxing any constraints with respect to the fill behavior as are typically encountered in conventional electroplating regimes for reliably filling high aspect ratio openings in a bottom to top fashion. Consequently, in combination with a highly efficient definition of the respective via openings 304A and trenches 304B in a common imprint process, an additional reduction in process complexity and process performance with respect to fill behavior and barrier deposition may be obtained.

Figure 3C:
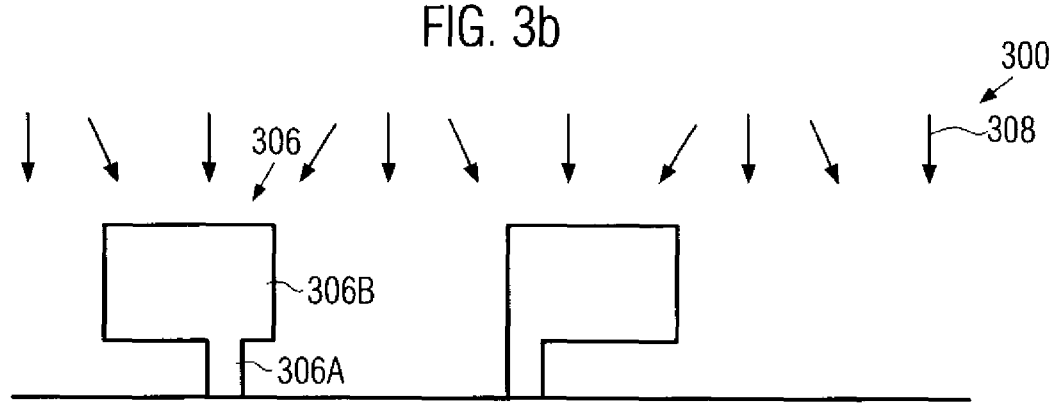

FIG. 3c schematically illustrates the microstructure device 300 during a selective isotropic etch process 308 for removing the sacrificial layer 303 selectively to the metallization structure 306. For this purpose, highly selective etch recipes may be used, wherein a high degree of flexibility in the selection of appropriate materials is provided, since the layer 303 is only provided with respect to the desired characteristics during the common imprint process while the dielectric characteristics thereof are irrelevant.

Figure 3D:
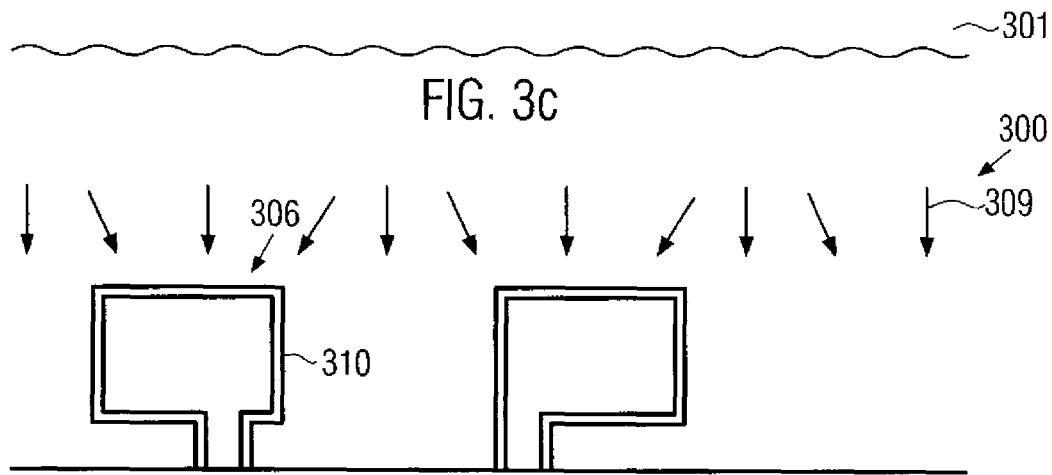

FIG. 3d schematically illustrates the microstructure device 300 in a further advanced manufacturing stage. Here, the device 300 is subjected to a treatment 309 for forming a respective barrier layer 310 on exposed surface portions of the metallization structures 306. As previously explained, for a plurality of highly conductive metals, such as copper, copper alloys and the like, a reliable enclosure of the metal is required in order to suppress any interaction with the surrounding dielectric material. Furthermore, due to the moderately high current densities that may typically be encountered in highly sophisticated integrated circuits, electromigration effects may play a dominant role with respect to the overall reliability and thus lifetime of respective metallization structures. Since electromigration effects are highly correlated with the existence of diffusion paths, any interface regions may be especially highly critical with respect to electromigration and hence the overall electromigration behavior may depend significantly on the quality of the respective interfaces with the barrier material. Consequently, due to the provision of the barrier layer 310 without the presence of a surrounding dielectric material, highly efficient manufacturing techniques, such as electroless plating, may be used, thereby providing reliable and uniform enclosure of the metallization structures 306 while additionally highly effective barrier materials, such as cobalt/tungsten/boron, cobalt/tungsten/phosphorous and the like, may be formed which are known to exhibit a high resistance against electromigration effects in combination with copper material. Consequently, by correspondingly exposing the surface portions of the metallization structure 306, the respective materials may be deposited in a self-aligned manner, thereby forming the barrier layer 310 in a highly uniform fashion. Consequently, the overall performance of the respective metallization structure 306 may be significantly increased while nevertheless reduced process complexity and increased accuracy may be achieved due to the common patterning of the respective via openings 304A and trenches 304B.

Figure 3E:
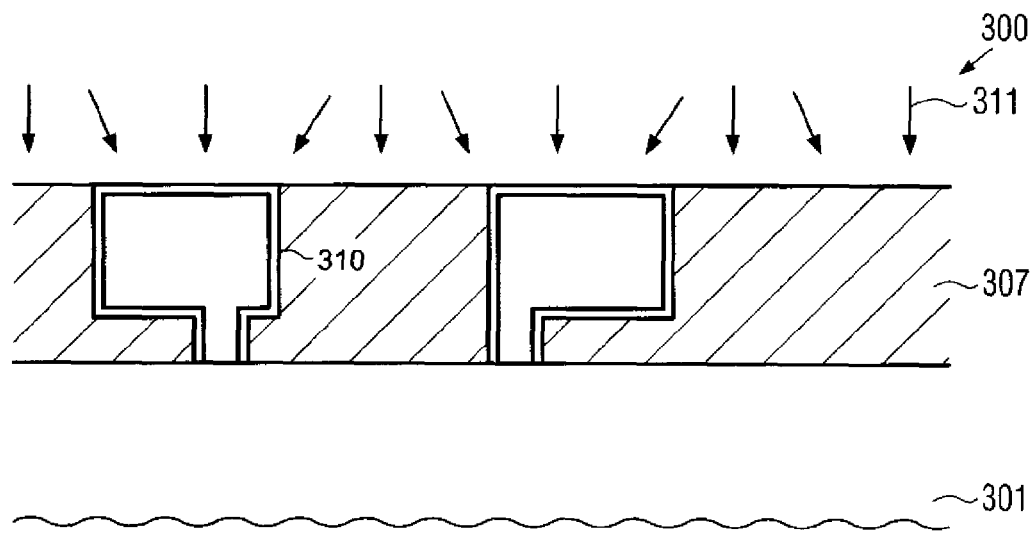

FIG. 3e schematically illustrates the microstructure device 300 during a deposition process 311 for forming an appropriate dielectric layer 307 in order to define, in combination with the metallization structures 306, a respective metallization layer. The deposition process 311 may represent any appropriate deposition technique, such as spin-on techniques, CVD techniques and the like, in order to reliably enclose the metallization structures 306 with an appropriate dielectric material, which may have a low relative permittivity as may be required for sophisticated integrated circuits. Depending on the characteristics of the deposition process 311, any excess material of the dielectric layer 307 may be removed, for instance by CMP, in order to provide a substantially planar surface topography, wherein the process may be reliably stopped upon exposing upper portions of the barrier layer 310, while, in other illustrative embodiments, CMP may be combined with a selective etch process, which may also be controlled on the basis of the exposure of the barrier layer 310.

Figure 4A:
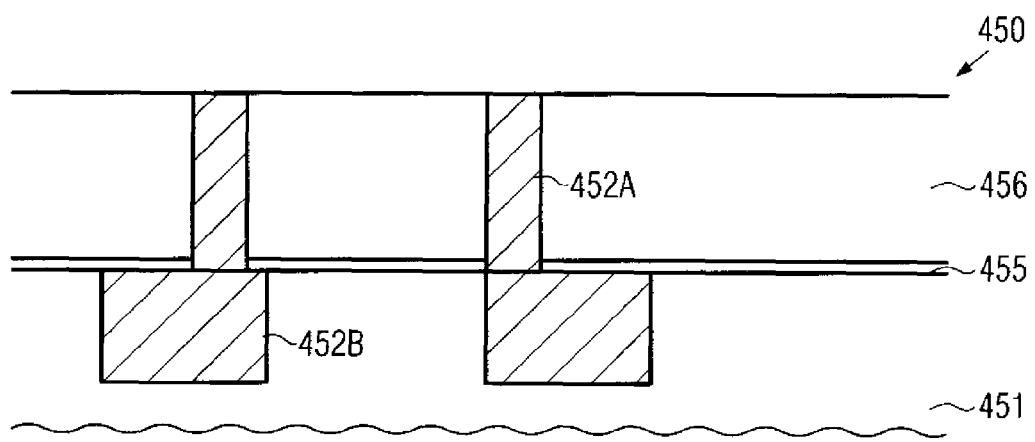
FIGS. 4a-4c schematically illustrate a process flow for forming an imprint mold or die, i.e., a negative form of a via/line structure according to yet other illustrative embodiments.
Figure 4B:
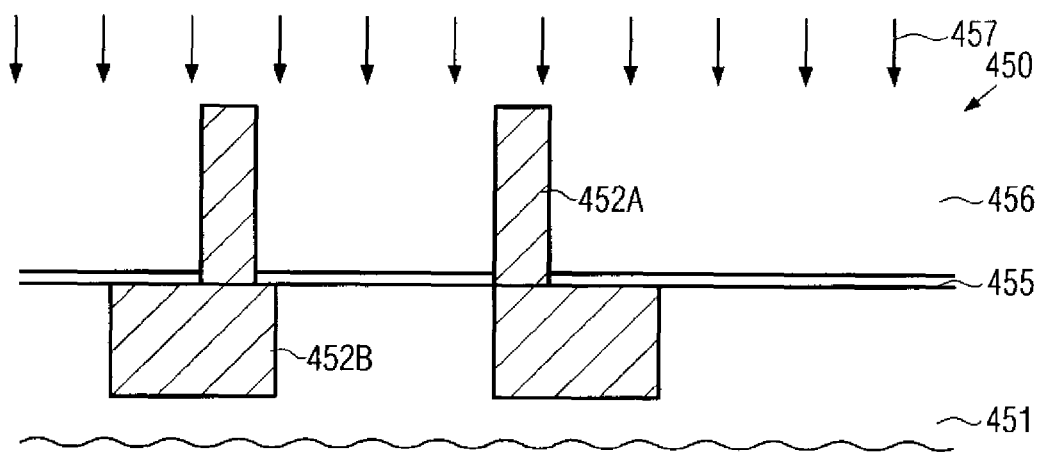
Figure 4C:
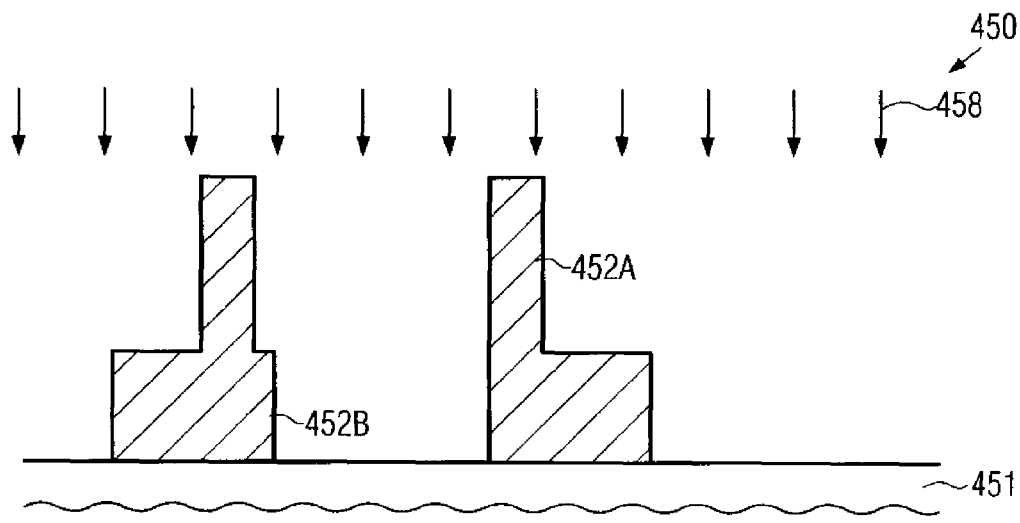

With reference to FIGS. 4a-4c, further illustrative embodiments will now be described, in which an appropriate imprint mold or die may be formed so as to provide a negative form for a via opening in combination with a trench.

FIG. 4a schematically illustrates a cross-sectional view of an imprint mold or die 450 in an advanced manufacturing stage. The die 450 may comprise any appropriate substrate 451, which may represent any appropriate carrier material having formed thereon a surface portion that may enable an appropriate patterning in accordance with respective process techniques. For example, the substrate 451 may represent a silicon substrate having formed thereon a silicon layer, a silicon dioxide layer, or any other appropriate material providing the required mechanical stability and respective etch characteristics during the subsequent processing for forming therein a respective negative image or form of via openings and trenches. Corresponding negative forms of trenches 452B may be formed in an upper portion of the substrate 451 or any appropriate material layer provided on the substrate 451, wherein the negative forms 452B may be comprised of any appropriate material, such as silicon dioxide, silicon nitride and the like, which may have a high etch selectivity with respect to the surrounding material of the substrate 451. Moreover, an etch stop layer 455 may be formed above the substrate 451 followed by an additional material layer 456, in which may be formed respective negative forms of via openings 452A. The negative forms 452A may be comprised of substantially the same material as the negative forms 452B or may be comprised of a different material, depending on the process and device requirements. In the illustrative embodiment shown in FIG. 4a, the material of the layer 456 and the material of the negative forms 452A may exhibit a high degree of etch selectivity with respect to a specified etch recipe. For instance, the layer 456 may be comprised of polysilicon and the like, while the negative forms 452A may be comprised of silicon dioxide, silicon nitride and the like.

A typical process flow for forming the imprint mold 450 as shown in FIG. 4a may comprise the following processes. First, the substrate 451 may be patterned in order to receive respective trenches, which may be accomplished on the basis of photolithography and respective etch techniques in order to provide a respective resist mask and patterning the substrate 451 on the basis of the resist mask. In other illustrative embodiments, a respective mask layer including a moldable material may be patterned on the basis of a respective imprint mold and subsequently the resulting patterned mask layer may be used as an etch mask for transferring the respective trenches into the substrate 451. For example, respective etch techniques for silicon or any other appropriate material are well-established in the art. Thereafter, trenches formed in the substrate 451 may be filled by an appropriate material, such as silicon dioxide and the like, on the basis of well-established deposition techniques, such as high density plasma CVD, sub-atmospheric CVD and the like. Thereafter, the surface topography may be planarized by CMP and the etch stop layer 455, for instance comprised of silicon nitride, may be deposited on the basis of well-established process techniques. The layer 456 may be deposited, for instance by low pressure CVD when provided in the form of a polysilicon material. Subsequently, the layer 456 may be patterned to receive respective openings corresponding to the negative forms 452A, which may be accomplished on the basis of photolithography and anisotropic etch processes or on the basis of an imprint process technique, in which a corresponding moldable material layer may be formed above the layer 456 that may then be patterned by respective imprint techniques, as is also described above. Thereafter, based on a corresponding resist mask or any other etch mask, the layer 456 may be patterned and the respective openings may be refilled by an appropriate material, such as silicon dioxide and the like. Consequently, the die 450 as illustrated in FIG. 4a may be formed on the basis of well-established photolithography techniques or on the basis of imprint techniques in which the negative forms 452B and 452A are manufactured in subsequent process steps.

FIG. 4b schematically illustrates the imprint die 450 in a further advanced manufacturing stage. In one illustrative embodiment, a selective etch process 457 may be performed in order to selectively remove the material of the layer 456 while substantially maintaining the material of the negative forms 452A. For instance, highly selective wet chemical etch processes are well established in the art for selectively removing polysilicon with respect to silicon dioxide. In other embodiments, highly selective dry etch processes may be used. In other illustrative embodiments, the etch process 457 may represent a highly anisotropic etch process based on an etch mask (not shown) that substantially covers the negative forms 452A, which may be directly formed from the layer 456. For this purpose, the imprint mold 450 may be formed so as to receive the negative forms 452B in a similar way as previously described with reference to FIG. 4a, and subsequently the etch stop layer 455 and the layer 456 may be deposited as described above. Thereafter, a respective etch mask, for instance in the form of a resist mask, formed by photolithography or any other mask, for instance formed by imprint technique, may be used in order to cover the portions 452A, which may then be formed during the etch process 457 from the material of the layer 456. Consequently, irrespective of the selected strategy, the negative forms 452A may be provided after the completion of the etch process 457.

FIG. 4c schematically illustrates the imprint die 450 during a further selective etch process 458 in order to selectively remove material of the substrate 451 with respect to the materials of the negative forms 452A, 452B. For instance, highly selective etch recipes for removing silicon with respect to silicon dioxide are well established in the art. In order to reliably control the etch process 458, a corresponding etch stop layer (not shown), which may be comprised of substantially the same material as the negative forms 452A, 452B, may be provided for this purpose. Consequently, after the completion of the etch process 458, the respective negative forms 452A, 452B are exposed and may substantially represent corresponding via openings and trenches for a metallization structure to be formed in other substrates on the basis of a common imprint process. It should be appreciated that the die 450 may be prepared in any appropriate manner for subsequent imprint processes by, for instance, surface modification processes in order to appropriately reduce the surface roughness or adhesion with respect to any appropriate moldable material. For instance, respective thin surface films may be formed on the basis of appropriate deposition techniques, such as CVD, ALD and the like. In other illustrative embodiments, respective surface treatments, for instance by nitridation and the like, may be performed in order to provide the desired surface characteristics. It should also be appreciated that, depending on the process techniques, the specific configuration, i.e., size and shape of the respective negative forms, may be adjusted on the basis of the preceding process techniques. For instance, if a different height for respective negative forms 452B is required, corresponding portions of the die 450 may be covered and a corresponding anisotropic etch process may be performed in order to selectively remove material from non-covered negative forms 452B. In other cases, when the respective etch masks are defined by imprint techniques, different sizes and forms of the respective negative forms 452A, 452B may be obtained on the basis of the respective imprint molds. Consequently, the die 450 may be efficiently used in the process techniques as previously described with reference to the microstructural devices 100, 200 and 300 and may also be used in combination with other illustrative embodiments still to be described. In still other illustrative embodiments, the imprint mold 450 may itself be formed as a metallization structure, which may then be "imprinted" on a respective microstructure device, such as the devices 100, 200 and 300 as previously described.

Figure 5:
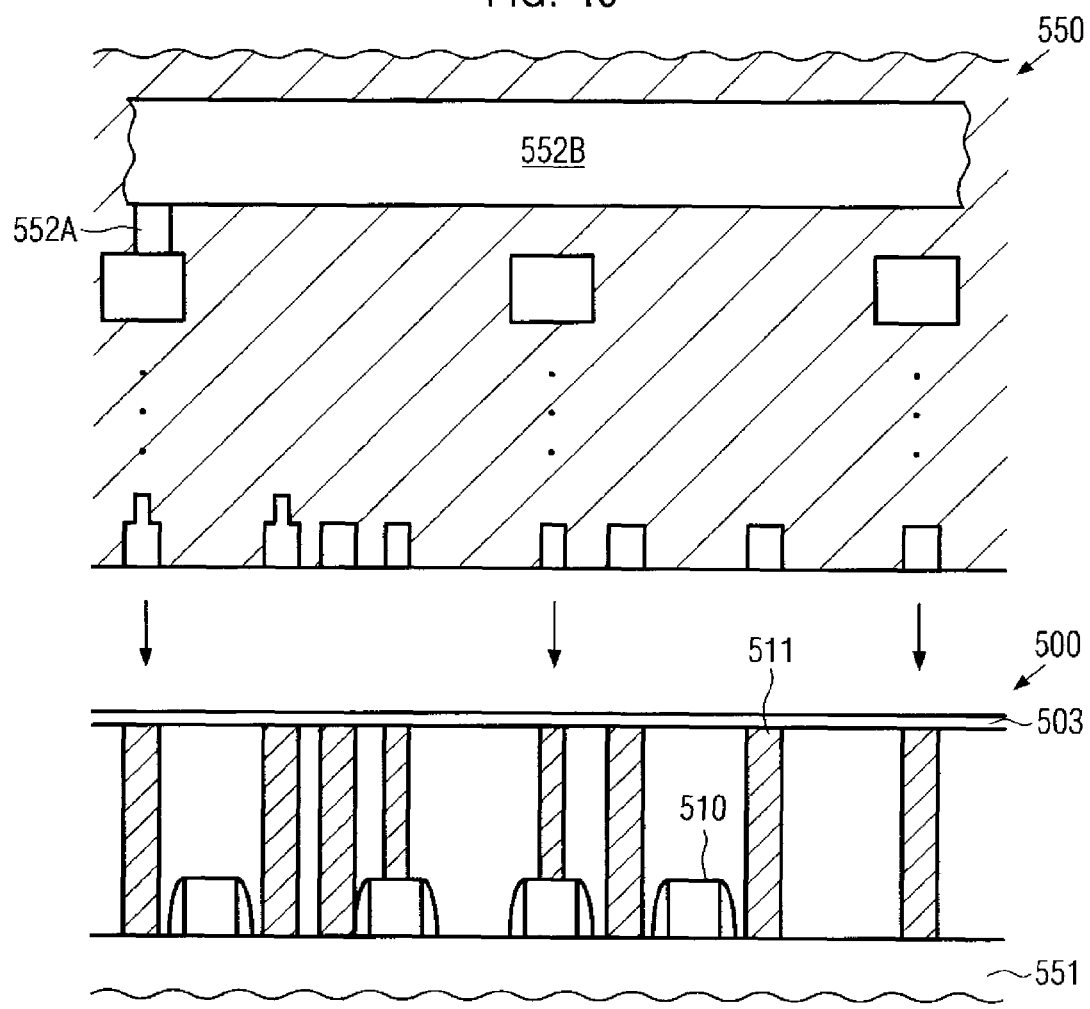
FIG. 5 schematically illustrates a mechanical transfer of one or more metallization structures to a substrate including a plurality of circuit elements in accordance with other illustrative embodiments disclosed herein.

FIG. 5 schematically illustrates a metallization structure 550, which, in some illustrative embodiments, may be considered as an "imprint mold or die" that is to be imprinted, i.e., mechanically connected, to a respective microstructure device 500, which may represent a semiconductor device including a plurality of circuit elements 510 connected to a respective number of contact portions 511. The metallization structure 550 may in turn comprise one or more metallization layers that may have been formed on the basis of the process techniques as previously described with reference to the respective metallization layers 107, 207 and 307 or which may be formed according to the process flow as described with reference to the imprint die 450, wherein the respective negative forms may be formed on the basis of an appropriate metal material. In one illustrative embodiment, the metallization structure 550 may be formed on the basis of respective imprint processes for commonly patterning respective metal lines 552B in combination with respective vias 552A, as is previously described, wherein a plurality of respective process sequences may be repeated in order to provide a plurality of metallization layers, if desired. The metallization structure 550 may then be aligned with respect to the device 500 on the basis of alignment procedures as previously described. Moreover, in some illustrative embodiments, a "moldable" layer 503 may be provided, for instance in the form of a thin layer of an appropriate electrolyte solution from which, upon contact of the metallization structure 550 with the layer 503, a selective material deposition may be initiated in order to provide electrical and mechanical contact with the contact portions 511. Thereafter, excess material of the layer 503 may be removed and may be replaced by an appropriate dielectric material, which may be applied in a highly viscous state.

Consequently, the metallization structure 550 may be formed on the basis of highly efficient imprint techniques, as previously described, wherein a high degree of decoupling of the process of forming the metallization structure of respective semiconductor devices and the manufacturing sequence for forming circuit elements may be achieved. In this way, the total manufacturing time for a completed device including the metallization structure 550 and the semiconductor device 500 may be significantly reduced, while additionally process flexibility and yield may improve since any failures in the metallization structure or in the device level may not result in a loss of a complete microstructure device.

Figure 6A:
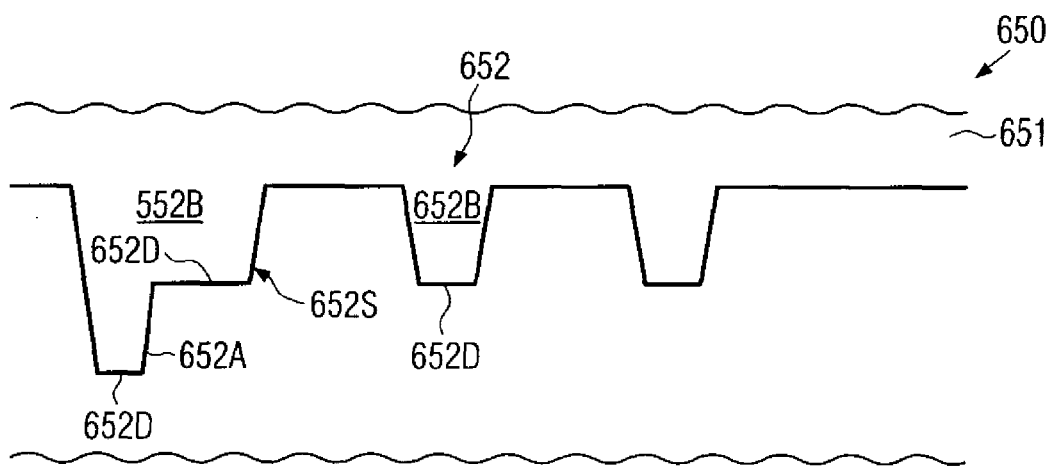
FIGS. 6a-6c schematically illustrate cross-sectional views of a plurality of imprint molds or die having a non-perpendicular sidewall configuration of respective negative forms of metallization features for semiconductor devices according to illustrative embodiments disclosed herein.
Figure 6B:
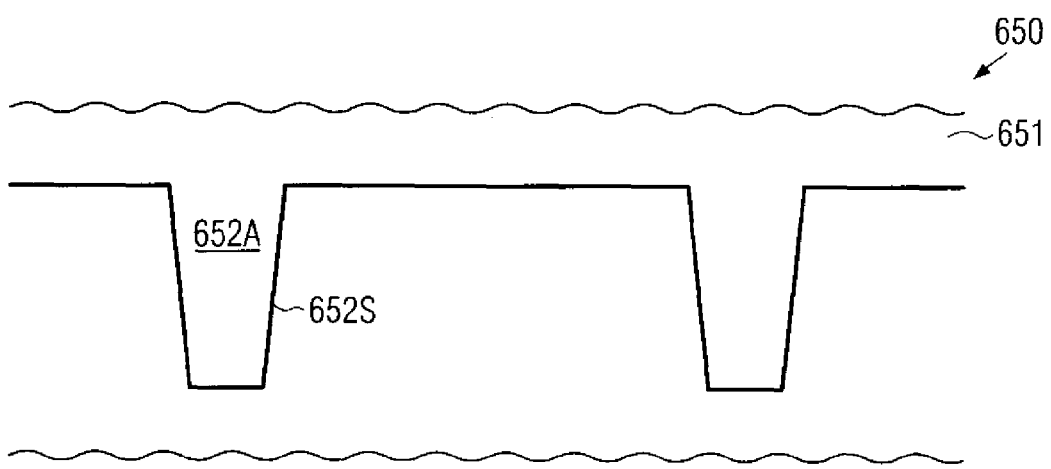
Figure 6C:
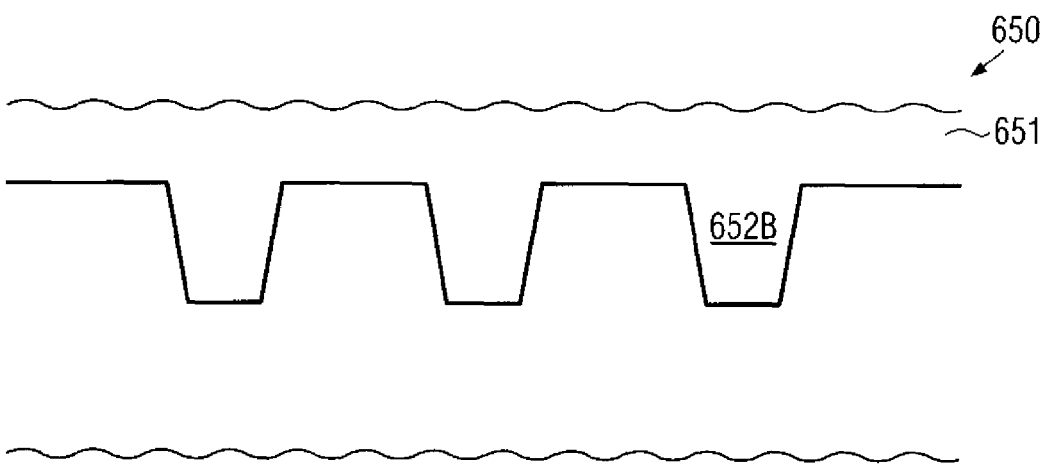

With reference to FIGS. 6a-6c, further illustrative embodiments will now be described, in which appropriately designed imprint molds or die are provided in order to provide appropriate shapes, especially of sidewall portions, of respective circuit features.

FIG. 6a schematically illustrates an imprint mold 650 comprising a substrate 651 and a plurality of negative forms 652 of respective circuit features, which, in one illustrative embodiment, may represent negative forms 652A for via openings and negative forms 652B for trenches for conductive lines of metallization structures. In other illustrative embodiments, the respective negative forms 652 may represent other circuit elements, such as isolation trenches, gate electrodes and the like, as will be described later on in more detail. With respect to the material composition of the substrate 651 and the negative forms 652, the same criteria apply as previously described with reference to the imprint molds 150, 250, 350, 450. In the embodiment shown, at least upper portions of respective sidewalls 652S of the negative forms 652A, 652B may comprise a non-perpendicular orientation with respect to a bottom portion 652D, wherein, in one illustrative embodiment, the respective sidewall portion 652S may define a tapered shape providing an increased width or diameter at a respective upper portion of via openings and trenches, which may efficiently improve the fill behavior during respective deposition techniques.

FIG. 6b schematically illustrates the imprint mold 650 having formed thereon the negative forms 652A for respective via openings, which may be advantageous when a patterning process may be performed separately for via openings and trenches. It should be appreciated that the sidewalls 652S of the negative form 652A may not necessarily have a continuous tapering along the entire depth but may have different sidewall angles, depending on the device and process requirements. For instance, a significant slope of the sidewall portion 652S may only be provided at an upper portion thereof, while a lower portion may have a substantially perpendicular orientation with respect to the bottom 652D. However, any other sidewall configuration may be provided, depending on the device requirements.

FIG. 6c schematically illustrates the imprint mold 650 including the negative form 652B for respective trenches wherein an appropriate size, in the present example, a respective tapering of the sidewall portions 652S may be provided in accordance with device requirements.

Consequently, upon using the imprint molds 650 for forming respective openings, the fill behavior in the subsequent deposition of a barrier material and/or the bulk material may be significantly enhanced, thereby increasing the reliability of the respective metallization structures, since, for instance, a more reliable deposition of barrier material may significantly contribute to an enhanced resistance against electromigration and may also provide improved electrical and mechanical characteristics. For example, the imprint mold 650 as shown in FIG. 6a may be advantageously used in combination with the process techniques described above, in which respective via openings and trenches are formed in a common imprint process. On the other hand, the imprint molds 650 as shown in FIGS. 6b and 6c may be advantageously used in respective process sequences, in which the respective via openings and trenches are patterned in separate process steps.

With reference to FIGS. 7a-7b and 8a-8d, further illustrative embodiments will now be described in which respective imprint molds having non-perpendicular sidewall portions may be used for patterning circuit elements other than metallization structures for sophisticated integrated circuits.

Figure 7A:
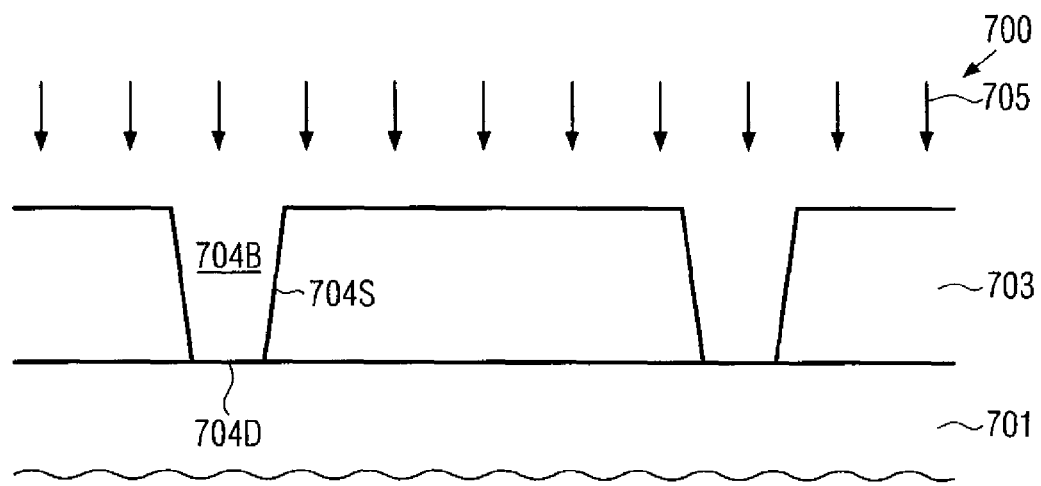
FIGS. 7a-7b schematically illustrate cross-sectional views of a semiconductor device during the formation of isolation trenches on the basis of tapered imprint die or molds according to yet other illustrative embodiments.

FIG. 7a schematically illustrates a cross-sectional view of a semiconductor device 700 comprising a substrate 701, which may represent any appropriate substrate having formed thereon a material layer for forming therein semiconductor elements, such as transistors, capacitors and the like. For example, the substrate 701 may represent a carrier material having formed thereon a silicon-based semiconductor layer for forming therein respective circuit elements. In this respect, a silicon-based semiconductor layer is to be understood as a substantially crystalline semiconductor layer comprising a significant amount of silicon, for instance approximately 50 atomic percent silicon or more. Moreover, a mask layer 703 may be formed above the substrate 701 and may have formed therein respective openings 704A having sidewalls 704S with at least partially a non-perpendicular orientation with respect to a bottom 704D of the openings 704A. In one illustrative embodiment, the openings 704B may represent trenches used for forming corresponding trenches in the substrate 701, which may act as isolation trenches for sophisticated semiconductor devices in order to define corresponding active regions in the substrate 701.

A typical process flow for forming the device 700 as shown in FIG. 7a may comprise the following processes. After the provision of the substrate 701, the layer 703 may be formed by any appropriate deposition technique, wherein the material of the layer 703 is a moldable material, that is, the layer 703 may be in a state of low viscosity or may be highly deformable when brought into contact with a corresponding imprint mold (not shown) which may have any appropriate shape, as is for instance explained with reference to FIG. 6c. Hence, the respective imprint mold having respectively designed sidewall portions may result in the formation of the corresponding openings 704B having a required non-perpendicular shape, for instance a tapered configuration as is shown in FIG. 7a. Thereafter, the imprint mold may be removed, as previously described, while the material of the layer 703 is in a highly non-deformable state. Thereafter, the device 700 may be subjected to a corresponding etch process 705, during which material of the layer 703 and the material of exposed portions of the substrate 701 may be removed, thereby increasingly transferring the opening 704B into the substrate 701.

Figure 7B:
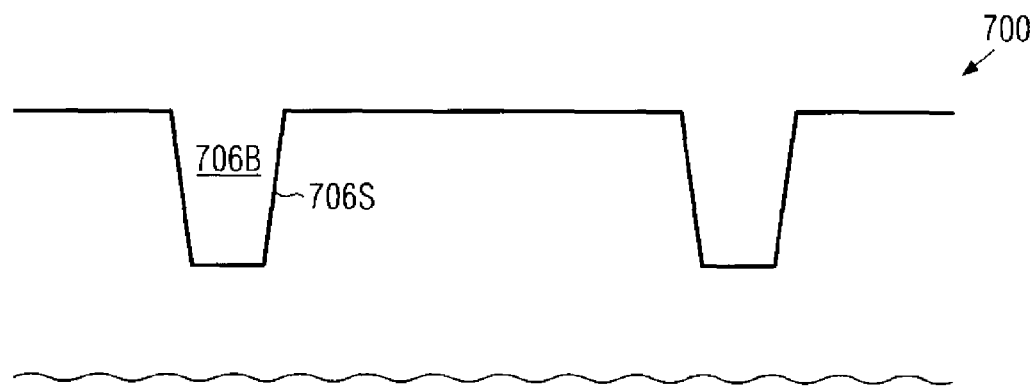

FIG. 7b schematically illustrates the semiconductor device 700 after the completion of the etch process 705, wherein respective openings 706B are formed in the substrate 701, wherein a desired tapering, that is, a non-perpendicular configuration of the respective sidewall portion 706S, is obtained on the basis of respectively shaped openings 704B. Hence, by providing the respective imprint molds with a desired size and shape, the respective configuration of the openings 706B may be designed with high flexibility without requiring specifically adapted etch techniques and the like.

Figure 8A:
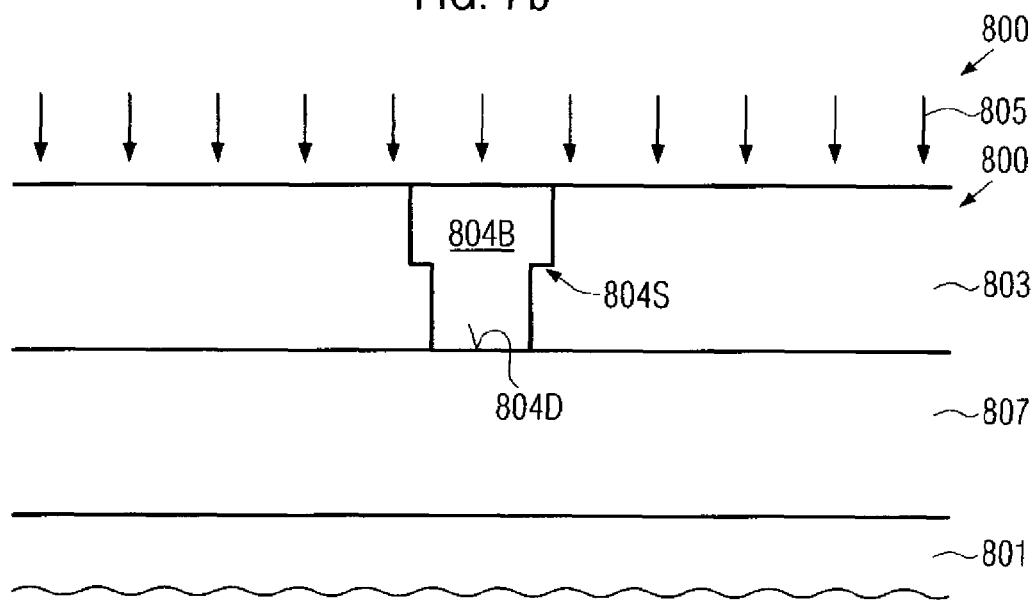
FIGS. 8a-8d schematically illustrate cross-sectional views of a semiconductor device during various manufacturing stages for forming a conductive line, such as a gate electrode, having a modified sidewall configuration obtained by an imprint technique according to other illustrative embodiments disclosed herein.

FIG. 8a schematically illustrates a semiconductor device 800 comprising a substrate 801 having formed thereon a material layer 807, which may, in one illustrative embodiment, comprise any appropriate material, such as silicon dioxide and the like, which may be compatible with subsequent process steps. Moreover, a mask layer 803 may be formed above the layer 807 and may have formed therein a corresponding opening 804B having a specified shape including a non-perpendicular sidewall portion 804S with respect to a bottom 804D of the opening 804B. In the embodiment illustrated in FIG. 8a, the opening 804B may have an increased diameter at an upper portion while exhibiting a substantially constant width at a lower portion. For example, the opening 804B may represent a gate electrode to be formed above the substrate 801.

A typical process flow for forming the semiconductor device 800 as shown in FIG. 8a may comprise similar processes as described above, wherein, after the formation of any isolation structures, which may be formed on the basis of isolation trenches as shown in FIGS. 7a and 7b, the material layer 807 may be formed on the basis of well-established deposition techniques. Thereafter, the layer 803 of moldable material may be formed on the basis of appropriate techniques and thereafter the opening 804B may be formed on the basis of an appropriately designed imprint mold to obtain the desired configuration of the shape of the opening 804B. In the present example, a substantially constant lower portion of the substantially constant width may be provided in order to obtain a well-defined gate length, while the upper portion thereof may provide enhanced conductivity of the respective gate electrode. After the formation of the opening 804B by correspondingly hardening the layer 803 and removing the respective imprint mold, the device 800 may be subjected to a respective anisotropic etch process 805 to commonly remove material of the layer 803 and of exposed portions of the layer 807, thereby increasingly transferring the opening 804B into the layer 807.

Figure 8B:
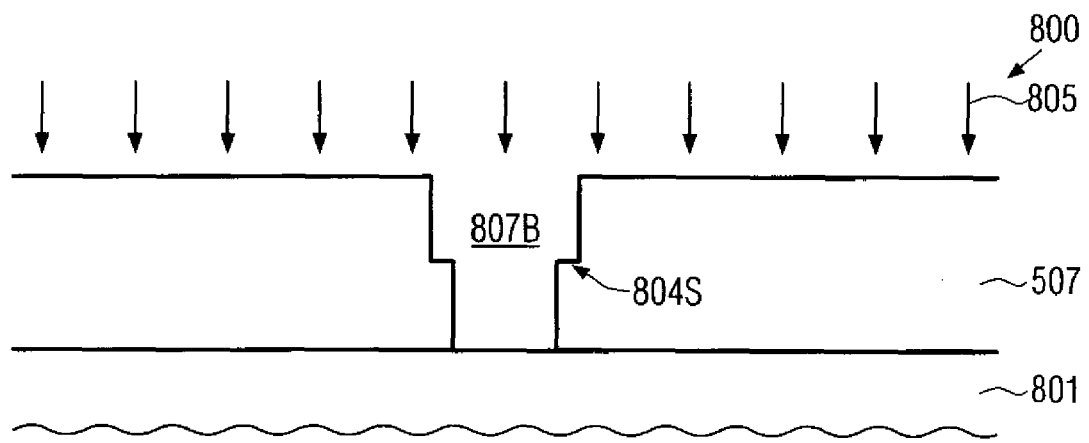

FIG. 8b schematically illustrates the device 800 after the completion of the etch process 805, thereby resulting in a corresponding opening 807B.

Figure 8C:
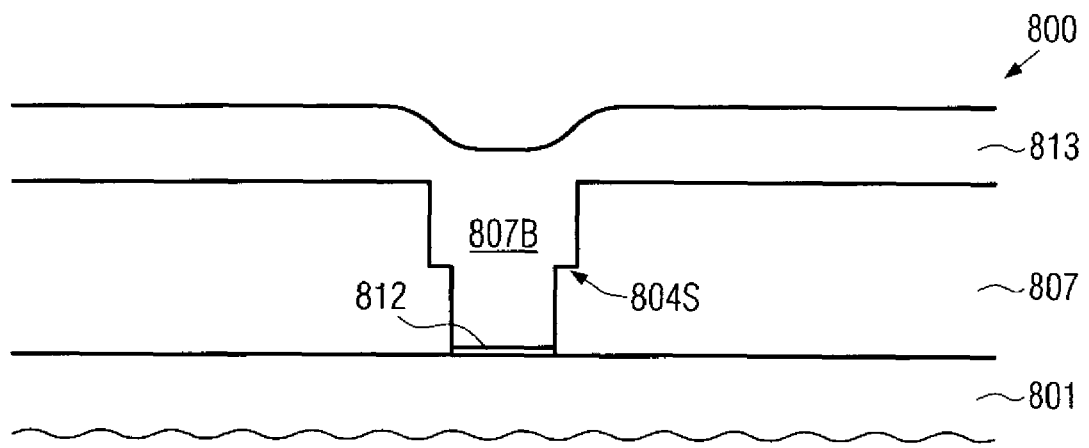

FIG. 8c schematically illustrates the device 800 in a further advanced manufacturing stage. Here, a gate insulation layer 812 is formed at the bottom of the opening 807B, wherein the gate insulation layer 812 may have any appropriate configuration with respect to material composition and thickness as is required by respective transistor elements still to be formed. Moreover, a layer of gate electrode material 813, for instance polysilicon and the like, may be formed so as to reliably fill the opening 807B. For this purpose, appropriate deposition techniques, such as low pressure CVD and the like, may be used. Thereafter, any excess material of the layer 813 may be removed by CMP.

Figure 8D:
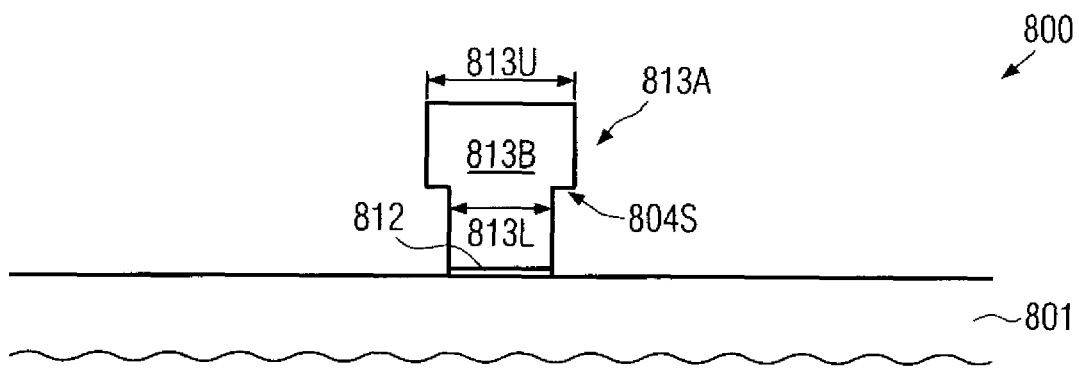

FIG. 8d schematically illustrates the device 800 in a further advanced manufacturing stage. Here the layer 807 is removed so as to maintain a gate electrode 813A having an upper portion with a width 813U and having a lower portion with a width 813L, thereby providing increased conductivity of the gate electrode 813A while still maintaining a required gate length that is substantially defined by the width 813L. The gate electrode 813A may be formed on the basis of a highly selective etch process, wherein well-established isotropic etch techniques may be used. For instance, if the gate insulation layer 812 may be comprised of silicon nitride, well-established isotropic etch recipes may be used in order to remove the material of the layer 813 when provided in the form of silicon dioxide, selectively to the gate electrode 813A and the gate insulation layer 812. In other cases, when the gate insulation layer 812 may be formed on the basis of silicon dioxide, an appropriate material may be selected for the layer 807, for instance silicon nitride, or any other appropriate material, such as polymer materials and the like, which may only have the capability of enabling a reliable deposition of the gate electrode material 813.

As a result, the subject matter disclosed herein provides an enhanced technique for patterning features of microstructures and, in some illustrative embodiments, of metallization structures, such as vias and metal lines, on the basis of imprint techniques, in which process complexity may be significantly reduced by avoiding at least some complex alignment procedures by commonly imprinting via openings and trenches. For this purpose, appropriately configured imprint molds including a via and line structure may be used. In other aspects, the shape, in particular the sidewall configuration of respective circuit features, may be adapted on the basis of respectively designed imprint molds, thereby providing a high degree of flexibility for the formation of circuit elements, such as vias, metal lines, isolation trenches, gate electrodes and the like, wherein, in addition to the overall size, the sidewall configuration may be adapted so as to include a non-perpendicular portion for improving the manufacturing process and/or the final performance of the respective circuit feature. Thus, in addition to a reduced process complexity, an enhanced device performance may be achieved since, for instance, with respect to metallization structures, an enhanced reliability and performance in view of electromigration may be obtained. Moreover, the "mechanical" patterning of at least significant portions of a metallization structure may provide increased flexibility of forming the respective structures, wherein, in some illustrative embodiments, the formation of metallization structures may be completely decoupled from the formation of circuit elements in the device level, which may significantly reduce the overall manufacturing time and increase production yield.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   commonly imprinting a via opening and a trench into a moldable material layer formed above a substrate, said via opening and said trench corresponding to features of a metallization structure of a microstructure device;
   forming a via and a conductive line on the basis of said via opening and said trench by substantially completely filling said via opening and said trench with a conductive material;
   substantially removing said moldable material layer to expose surface portions of said via and said conductive line; and
   forming a conductive barrier layer on the exposed surface portions to encompass said via and said conductive line.

2. The method of claim 1, wherein said moldable material layer comprises a dielectric material having a relative permittivity of approximately 3.0 or less.

3. The method of claim 1, further comprising removing residues of said moldable material layer from a bottom of said via opening prior to forming said via and said conductive line.

4. The method of claim 1, further comprising forming an imprint mold representing a negative image of said via and said conductive line and commonly imprinting said via opening and said trench into a plurality of moldable material layers provided above a plurality of substrates.

5. The method of claim 4, wherein forming said imprint mold comprises performing a lithography process and an etch process for patterning a mold substrate so as to receive said negative image of said via opening and said trench.

6. The method of claim 4, wherein said imprint mold is formed by an imprint process.

* * * * *